US008868381B2

(12) United States Patent
Komatsu et al.

(10) Patent No.: US 8,868,381 B2
(45) Date of Patent: Oct. 21, 2014

(54) CONTROL SYSTEM DESIGN SIMULATION USING SWITCHED LINEARIZATION

(75) Inventors: Hideaki Komatsu, Yokohama (JP); Hitomi Takahashi, Kawasaki (JP); Gang Zhang, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 12/961,479

(22) Filed: Dec. 6, 2010

(65) Prior Publication Data

US 2011/0137631 A1 Jun. 9, 2011

(30) Foreign Application Priority Data

Dec. 7, 2009 (JP) .................................. 2009-278002

(51) Int. Cl.
| | | |
|---|---|---|
| G06F 17/50 | (2006.01) | |
| G06F 11/36 | (2006.01) | |
| G05B 19/406 | (2006.01) | |
| G05B 19/4061 | (2006.01) | |
| G05B 19/4063 | (2006.01) | |
| G06F 1/03 | (2006.01) | |
| G05B 17/00 | (2006.01) | |
| G05B 23/02 | (2006.01) | |
| G06F 17/10 | (2006.01) | |
| G06F 9/44 | (2006.01) | |
| G05B 13/04 | (2006.01) | |

(52) U.S. Cl.
CPC .......... *G06F 17/5009* (2013.01); *G05B 19/406* (2013.01); *G05B 23/0243* (2013.01); *G06F 17/10* (2013.01); *G06F 11/3668* (2013.01); *G05B 19/4061* (2013.01); *G05B 23/0205* (2013.01); *G05B 19/4063* (2013.01); *G06F 8/34* (2013.01); *G05B 13/04* (2013.01); *G06F 1/03* (2013.01); *G05B 17/00* (2013.01)
USPC .................................................. 703/2; 700/54

(58) Field of Classification Search
None
See application file for complete search history.

(56) References Cited

U.S. PATENT DOCUMENTS

| | | | | |
|---|---|---|---|---|
| 6,757,579 | B1 * | 6/2004 | Pasadyn ........................ | 700/108 |
| 7,603,185 | B2 * | 10/2009 | Stewart et al. .................. | 700/32 |

(Continued)

FOREIGN PATENT DOCUMENTS

| | | |
|---|---|---|
| JP | 05-181654 A | 7/1993 |
| JP | 11-224106 | 8/1999 |
| JP | 2002-127059 A | 8/2002 |

OTHER PUBLICATIONS

D.J. Leith, WE. Leithead, "Survey of Gain-Scheduling Analysis & Design" (1999) available at <http://eprints.nuim.ie/1834/1/1001965764_link_19992.pdf>.*
The Mathworks "SimuLink: Model-Based and System-Based Design" Simulink Reference Version 5 (2001). Selected pages on model verification, 1-2, 18-19, 40-41, 61-89.*

(Continued)

*Primary Examiner* — Kamini S Shah
*Assistant Examiner* — Jay B Hann
(74) *Attorney, Agent, or Firm* — Cantor Colburn LLP

(57) ABSTRACT

A method converts a plurality of functional blocks into linear blocks such that the nonlinear blocks are divided into a plurality of states through switched linearization. The plurality of states generated by said switched linearization is then transitioned selectively based on a predetermined operational scenario. Each state is then tested separately to ensure that implementation of the states are safe. A first guard block is provided when a state is deemed unsafe such that the first guard block is enabled to cause a system shutdown so as to prevent further processing that can cause an unsafe result.

21 Claims, 24 Drawing Sheets

(56) References Cited

U.S. PATENT DOCUMENTS

| | | | |
|---|---|---|---|
| 7,680,637 B1 * | 3/2010 | Wolodkin | 703/6 |
| 7,970,482 B2 * | 6/2011 | Srinivasan et al. | 700/31 |
| 8,046,207 B2 * | 10/2011 | Glass et al. | 703/13 |
| 2006/0058986 A1 * | 3/2006 | Glass | 703/2 |
| 2010/0312364 A1 * | 12/2010 | Eryilmaz et al. | 700/30 |

OTHER PUBLICATIONS

Patton, Thomas E. "On N-adic Representation of Numbers" J. Symbolic Logic vol. 28, No. 2, p. 161 (Jun. 1963).*

Shugen Ma et al., "Omni-directional Walking of Quadruped Robots with Non-zero Stability Margin" The Robotics Society of Japan, Oct. 12, 2001, 1H34.

* cited by examiner

|  | B1 | B2 | B3 | B4 | B5 |
|---|---|---|---|---|---|
| 0 | 1 | 0 | 1 | 0 | 0 |
| 1 | 0 | 1 | 0 | 1 | 1 |
| 2 | 2 | 2 | 2 | 2 | 2 |
| 3 |  |  |  | 3 | 3 |
| 4 |  |  |  |  | 4 |

BLOCK NO.: B1–B5
OPERATING REGION: rows 0–4

ORDER OF BLOCKS: 0 1 2 3 4

FIG. 9

| | | | | | | |
|---|---|---|---|---|---|---|
| 1 | 0 | 1 | 0 | 0 | 35% | Safe |
| 1 | 1 | 0 | 1 | 4 | 25% | Safe |
| 2 | 1 | 0 | 3 | 4 | 20% | Safe |
| 0 | 0 | 2 | 3 | 1 | 5% | Safe |
| 1 | 1 | 2 | 1 | 1 | 4% | UnSafe |
| 1 | 0 | 1 | 0 | 2 | 4% | UnSafe |
| 2 | 0 | 2 | 2 | 2 | 3% | UnSafe |
| 1 | 1 | 1 | 2 | 0 | 2% | UnSafe |
| 1 | 2 | 1 | 1 | 2 | 2% | UnSafe |

0 - 2     0 - 3   0 - 4   NUMBER OF STATES

| | | | | | | |
|---|---|---|---|---|---|---|
| ① | ⓪ | ① | ⓪ | ⓪ | 35% | Safe |
| 1 | 1 | ⓪ | 1 | 4 | 25% | Safe |
| 2 | 1 | ⓪ | 3 | 4 | 20% | Safe |
| ⓪ | 0 | 2 | 3 | 1 | 5% | Safe |
| ① | 1 | 2 | 1 | 1 | 4% | UnSafe |
| ① | 0 | ① | 0 | 2 | 4% | UnSafe |
| 2 | 0 | 2 | 2 | 2 | 3% | UnSafe |
| ① | 1 | ① | 2 | 0 | 2% | UnSafe |
| ① | 2 | ① | 1 | 2 | 2% | UnSafe |

FIG. 18

| | | | | | | |
|---|---|---|---|---|---|---|
| 0 | 0 | 0 | 0 | 0 | 35% | Safe |
| 0 | 1 | 1 | 1 | 4 | 25% | Safe |
| 2 | 1 | 1 | 3 | 4 | 20% | Safe |
| 1 | 2 | 0 | 3 | 1 | 5% | Safe |
| 0 | 2 | 1 | 1 | 1 | 4% | UnSafe |
| 0 | 0 | 0 | 0 | 2 | 4% | UnSafe |
| 2 | 2 | 0 | 2 | 2 | 3% | UnSafe |
| 0 | 0 | 1 | 2 | 0 | 2% | UnSafe |
| 0 | 0 | 2 | 1 | 2 | 2% | UnSafe |

| 0 | 0 | 0 | 0 | 0 |
|---|---|---|---|---|
| ① | ① | ① | ① | ① |
| ② | ② | ② | ② | ② |
| | | | ③ | ③ |
| | | | | ④ |

○ ••• REPLACEABLE VALUE

FIG. 19

|   |   |   |   |   |     |        |   |
|---|---|---|---|---|-----|--------|---|
| 0 | 0 | 0 | 0 | 0 | 35% | Safe   |   |
| 0 | 0 | 0 | 0 | 2 | 4%  | UnSafe | 1 |
| 0 | 0 | 2 | 2 | 0 | 2%  | UnSafe | 2 |
| 0 | 0 | 2 | 1 | 2 | 2%  | UnSafe | 3 |
| 0 | 1 | 1 | 1 | 4 | 25% | Safe   |   |
| 0 | 2 | 1 | 1 | 1 | 4%  | UnSafe | 4 |
| 1 | 2 | 0 | 3 | 1 | 5%  | Safe   |   |
| 2 | 2 | 0 | 2 | 2 | 3%  | UnSafe |   |
| 2 | 1 | 1 | 3 | 4 | 20% | Safe   | 5 |

HAMMING DISTANCE

FIG. 20

|   |   |   |   |   |     |        |   |
|---|---|---|---|---|-----|--------|---|
| 0 | 0 | 0 | 0 | 0 | 35% | Safe   |   |
| 0 | 0 | 0 | 0 | 2 | 4%  | UnSafe | 1 |
| 0 | 0 | ②| 2 | 0 | 2%  | UnSafe | 2 |
| 0 | 0 | ②| 1 | 2 | 2%  | UnSafe | 3 |
| 0 | ①| ①| 1 | 4 | 25% | Safe   | 2102 |
| 0 | ②| ①| 1 | 1 | 4%  | UnSafe | 4 |
| 1 | ②| 0 | 3 | 1 | 5%  | Safe   | 2104 |
| 2 | ②| 0 | 2 | 2 | 3%  | UnSafe | 2106 |
| 2 | ①| ①| 3 | 4 | 20% | Safe   | 5 |

HAMMING DISTANCE

FIG. 21

| | | | | | | | |
|---|---|---|---|---|---|---|---|
| 0 | 0 | 0 | 0 | 0 | 35% | Safe | |
| 0 | 0 | 0 | 0 | 2 | 4% | UnSafe | 1 |
| 0 | 0 | 1 | ②  | 0 | 2% | UnSafe | 2 |
| 0 | 0 | 1 | ① | 2 | 2% | UnSafe | 3 |
| 0 | 2 | 2 | ① | 4 | (25%) | Safe | ← |
| 0 | 1 | 2 | ① | 1 | 4% | UnSafe | |
| 1 | 1 | 0 | 3 | 3 | 5% | Safe | 4 |
| 2 | 1 | 0 | ② | 2 | 3% | UnSafe | |
| 2 | 2 | 2 | 3 | 4 | 20% | Safe | |
| 0 | 0 | 0 | 0 | 0 | | | |
| 1 | 1 | 1 | ① | ① | | | |
| 2 | 2 | 2 | ② | ② | | | |
| | | | 3 | ③ | | | |
| | | | | 4 | | | |

◯ ··· REPLACEABLE VALUE

FIG. 22

| 0 | 0 | 0 | 0 | 0 | 35% | Safe |
| 0 | 0 | 0 | 0 | 2 | 4% | UnSafe |
| 0 | 0 | 1 | 1 | 0 | 2% | UnSafe |
| 0 | 0 | 1 | 2 | 2 | 2% | UnSafe |
| 0 | 2 | 2 | (2) | 4 | 25% | Safe |
| 0 | 1 | 2 | 2 | 1 | 4% | UnSafe |
| 1 | 1 | 0 | 3 | 3 | 5% | Safe |
| 2 | 1 | 0 | 1 | 2 | 3% | UnSafe |
| 2 | 2 | 2 | 3 | 4 | 20% | Safe |

| 0 | 0 | 0 | 0 | 0 |
| 1 | 1 | 1 | 1 | (1) |
| 2 | 2 | 2 | 2 | (2) |
|   |   |   | 3 | (3) |
|   |   |   |   | 4 |

FIG. 23

| 0 | 0 | 0 | 0 | 0 | 35% | Safe |
|---|---|---|---|---|-----|------|
| 0 | 0 | 0 | 0 | 2 | 4%  | UnSafe |
| 0 | 0 | 1 | 1 | 0 | 2%  | UnSafe |
| 0 | 0 | 1 | 2 | 2 | 2%  | UnSafe |
| 0 | 2 | 2 | 2 | 4 | 25% | Safe |
| 0 | 1 | 2 | 2 | 1 | 4%  | UnSafe |
| 1 | 1 | 0 | 3 | 1 | 5%  | Safe |
| 2 | 1 | 0 | 1 | 2 | 3%  | UnSafe |
| 2 | 2 | 2 | 3 | 4 | 20% | Safe |

| 3(5) | 1(1) | 2(2) | 2(3) | 1(1) | ← SORT THESE VALUES IN ASCENDING ORDER FROM FIRST ROW |

FIG. 24

| 0 | 0 | 0 | 0 | 0 | 35% | Safe |
|---|---|---|---|---|-----|------|
| 2 | 0 | 0 | 0 | 0 | 4%  | UnSafe |
| 0 | 0 | 1 | 1 | 0 | 2%  | UnSafe |
| 2 | 0 | 1 | 2 | 0 | 2%  | UnSafe |
| 1 | 1 | 2 | 2 | 0 | 4%  | UnSafe |
| 1 | 1 | 0 | 3 | 1 | 5%  | Safe |
| 2 | 1 | 0 | 1 | 2 | 3%  | UnSafe |
| 4 | 2 | 2 | 2 | 0 | 25% | Safe |
| 4 | 2 | 2 | 3 | 2 | 20% | Safe |

| 1(1) | 1(1) | 2(2) | 2(3) | 3(5) |

FIG. 25

| | | | | | | |
|---|---|---|---|---|---|---|
| 0 | 0 | 0 | 0 | 0 | 35% | Safe |
| 2 | 0 | 0 | 0 | 0 | 4% | UnSafe |
| 0 | 0 | 1 | 1 | 0 | 2% | UnSafe |
| 2 | 0 | 1 | 2 | 0 | 2% | UnSafe |
| ①| 1 | 2 | 2 | 0 | 4% | UnSafe |
| ①| 1 | 0 | 3 | 1 | 5% | Safe ← |
| 2 | 1 | 0 | 1 | 2 | 3% | UnSafe |
| 4 | 2 | 2 | 2 | 0 | 25% | Safe |
| 4 | 2 | 2 | 3 | 2 | 20% | Safe |

| | | | | |
|---|---|---|---|---|
| 0 | 0 | 0 | 0 | 0 |
| ① | 1 | 1 | 1 | 1 |
| ② | 2 | 2 | 2 | 2 |
| ③ | | | 3 | |
| 4 | | | | |

FIG. 26

| | | | | | | |
|---|---|---|---|---|---|---|
| 0 | 0 | 0 | 0 | 0 | 35% | Safe |
| 0 | 0 | 1 | 1 | 0 | 2% | UnSafe |
| 2 | 0 | 0 | 0 | 0 | 4% | UnSafe |
| 2 | 0 | 1 | 2 | 0 | 2% | UnSafe |
| 2 | 1 | 0 | 1 | 2 | 3% | UnSafe |
| 3 | 1 | 0 | 3 | 1 | 5% | Safe |
| 3 | 1 | 2 | 2 | 0 | 4% | UnSafe |
| 4 | 2 | 2 | 2 | 0 | 25% | Safe |
| 4 | 2 | 2 | 3 | 2 | 20% | Safe |

FIG. 27

CONTROL SYSTEM DESIGN SIMULATION USING SWITCHED LINEARIZATION

CROSS REFERENCES

This application takes priority from foreign filed application JP 2009-278002 filed Dec. 7, 2009. That application is incorporated by reference herein.

BACKGROUND OF THE INVENTION

1. Field of the Invention

This invention generally relates to simulation technology, and more particularly to a simulation technology that improves efficiency during verification operations.

2. Description of Background

Traditionally multiprocessor systems, such as those used in scientific fields that require complex computations, include multiple processors. In handling such complex computations, many application programs are created that need to be then allocated to individual processors. The processors, in turn, not only have to handle the processing task but also perform other functions such as simultaneously communicating with one another. The complexity of such an arrangement creates many challenges. Since system reliability is key, accuracy and process execution has to be tested and ensured but doing so is often cost prohibitive.

In recent years, simulation has provided a more cost effective option when designing and testing such complex operations. The technological advancements in the field enables incorporation of better tools that aid such simulation. For example, simulation software can be used in robotics, mechatronics and even plant operations in a variety of industries including but not limited to automotive and aeronautic industries. This is especially relevant when electronic components are involved as those used in a robot, an automobile, or even an airplane. These electronic components can easily be duplicated or design controlled by simulation.

Even when the products are largely mechanical in nature, the still incorporate large amounts of control software that can be simulated ahead of time. Therefore, simulation can help both in shortening the long development cycle and reduce enormous cost and resource needs (i.e. large pool of manpower) associated with a variety of product development cycles.

A conventional simulation technique, used particularly in product testing, is known as "Hardware In the Loop Simulation" or (HILS). In automotive and other similar industries, HILS can be used to test all electronic control units (ECUs). Such an application is often referenced as a full-vehicle HILS. In full-vehicle HILS, a test is conducted in a laboratory according to a predetermined scenario that involves connecting a real ECU to a dedicated hardware device that emulates a variety of components, for example, an engine or a transmission mechanism. The output from the ECU is then used as an input to a monitoring computer, which is ultimately displayed, such as on a display device, to allow checking of any abnormal activities.

One shortcoming of prior art, especially as associated with techniques like HILS, is that actual and often dedicated hardware devices still needs to be used in the testing process. In addition, hardware devices have to be physically wired to the real ECUs, which provides particular challenges as preparation time and procedural steps can become extensive. Furthermore, some tests require the replacement of one or more ECUs with others, during the testing process, requiring the device and the ECU to be physically reconnected one or more time. This causes further delays and necessitates additional resources, at cost, to be used during the overall process. Most such tests also use real components such as ECUs that add even additional time and expense to the testing process.

To reduce the time and resources needs, including hardware device needs, software oriented programs and algorithms have been used more extensively in conjunction with simulation. One such popular simulation is known as is Software In the Loop Simulation or SILS. SILS uses software simulation to configure components to be mounted in the ECU, such as a microcomputers, I/O circuits, engines, transmissions and such that is necessary for control operations of processes used in a number of applications including design and manufacturing plants. SILS enables the necessary tests to be conducted without hardware requirements such as existence of ECUs.

A number of simulation modeling systems can also be utilized to provide operating and a system support for SILS. One such example is MATLAB®/Simulink® available from Mathworks Inc. FIG. 1B is a prior art illustration of a system, such as MATLAB®/Simulink®, used to provide support for SILS. In this example, functional blocks are arranged on a screen through a graphical interface as shown in the figure. The flow of processing as indicated by arrows is specified, thereby enabling the creation of a simulation program. The diagram of these blocks represents processing for one time step of simulation. This step can be then repeated at predetermined times so that the time-series behavior of the system to be simulated can be obtained with some accuracy.

After the block diagram of the functional blocks is created, it can be further converted to source code selectively in a computer language of choice, such as C. In one example, this can be easily achieved by using functionality from available products such as Real-Time Workshop®, as known to those skilled in the art. This C or other such source code is then compiled such that simulation process can be performed as SILS on another computer system.

The above solutions while providing alternative solutions to design and production cycle issues, still does not describe and address the safety testing concerns. The safety of the entire system as well as one or many of the created multiple functional blocks thus created and designed needs to be tested or somehow ensured before implementing it on a real machine. For example, a slight inaccuracy in an engine design can cause a rapid rise in its revolution, affecting the safety and reliability of the whole system (i.e. vehicle etc.)

To understand the importance of this concept, FIGS. 1A and 1B are block diagrams designed to pinpoint such issues. FIG. 1B shows an example of an unsafe system having a controller block 110 and a plant block 112. In the system of FIG. 1B, an actual output 116 diverges with time from an expected output 114 as shown. If such an unsafe condition occurs in a control system for an engine or brake, it means that a dangerous situation will be created. Therefore, there is a need for a technique for predetermining that the simulation system is unsafe.

FIG. 1A, by contrast, depicts a desired system that can operate safely. As shown, the example of FIG. 1A provides for a controller block 102 and a plant block 104. In the system of FIG. 1A, an actual output 108 once deviates from an expected output 106 as shown, and converges with time to follow the expected output. According to the modern control theory, the safety of the simulation system can be determined without operating the real machine. It would be desirous, therefore to have such a system as indicated earlier.

Prior art has struggled with providing practical solutions that can duplicate the theoretical approach shown in FIG. 1a. Prior art FIGS. 2-5 as will be discussed relate to such unsuccessful attempts.

FIG. 2, is an illustration of a prior art attempt that unfortunately only provides a solution in a limited number of cases. To provide an understanding of problems associated with FIG. 2, it needs to be examined in conjunction with FIG. 3. Referring back to FIG. 2, however, a discussion of the system needs to first be made.

In FIG. 2, a system is provided having a controller block 202, an actuator block 204 and a plant block 206. Output 210 is provided and compared with respect to an expected output 208. As shown, the controller block 202 and the actuator block 204 are converted into a flow graph 212 based on the block description. Here, "u" reflects the input and "y" is the output. Subsequently, a state matrix 214 is determined relating to the operation of the simulation system in the form of a matrix differential equation which is a function of time. The state matrix 214 is then converted into an eigenvalue matrix 216 according to a predetermined algorithm, and the simulation system is determined to be safe if the real parts of diagonal elements in the eigenvalue matrix 216 are all zero or less. Unfortunately, this application only provides accurate safety predictions in case of linear control systems as will be discussed now in relation to FIG. 3.

FIG. 3 illustrates a block diagram having a system with a controller block 302, an actuator block 304, a saturation block 306 and a plant block 308. The system operates such as to provide an actual plant output 312 with respect to an expected output 310. However, the plant output 312 diverges as shown. It is thus impossible to apply the safety determination method of FIG. 2 with any expectation of accurate safety prediction to this scenario. This is because of the existence of the nonlinear saturation block 306. Hence, as suggested earlier, the state matrix as a prediction tool is only usable in applications having linear control systems.

Some prior art methodology attempt to resolve this issue by utilizing a switched linear system method such as depicted in prior art FIG. 4. However, as will be discussed, this solution also has its own set of problems.

FIG. 4, is a block diagram illustration of a prior art system attempting to resolve the nonlinear system problems by dividing the nonlinear elements in the model into multiple regions (sometimes known as plural linear regions.) This results in a state transition diagram 310 that includes a portion 312 having three states 314, 316 and 318. Each state corresponds to cases with different values (equations) provided respectively to portion 312 of the state transition diagram 310. Of special importance is the value $x_2$ that is inputted into the nonlinear block 306, to determine what state the nonlinear block 306 can take. In this way, the system of FIG. 4 can be considered to include three quasi-linear state transition diagrams. This is to provide safety determinations using the state matrix with three state transition diagrams. Thus, the system of FIG. 4 alternates between a safe state 314, an unsafe state 316 and another unsafe state 318 depending on the input value $x_2$ as provided to the nonlinear block 306. In this way, even if a nonlinear block is included in the system (since plural state matrices are created depending on the conditions), safety conditions can be determined somewhat accurately.

Nonetheless, this solution still leaves another problem. Generally in most systems, there are multiple nonlinear blocks in one simulation system. The example of such a system is provided by way of example in FIG. 5 to aid understanding.

In FIG. 5, blocks 502, 504 and 506 are each representative of nonlinear block arrangement. Let us assume that each nonlinear block can be approximated in a switched linear system (for switching among three states.) In such an example, if the number of nonlinear blocks is N, the number of states will be $3^N$. Therefore, the number of transitions among states is $3^N(3^N-1)$. Even if N=5, the number of transitions among states will be about $3.4\times10^9$, a number that is too high to provide for actual practical testing of the variations. In reality, in case of most actual systems to be tested, the number of nonlinear blocks is often much more than the value discussed (N=5). Thus, a significant challenge emerges regarding how to conduct a reasonable test in a simulation system including multiple nonlinear blocks. Unfortunately, no known technique are currently known or presented by the prior art that can overcome such a combinatorial explosion problem.

Consequently, a system and method is desired that can test for simulation systems with multiple linear blocks efficiently.

SUMMARY OF THE INVENTION

The shortcomings of the prior art are overcome and additional advantages are provided through the provision of a system, program product and related method for simulating operational processes of a machine having a plurality of operational functional blocks including nonlinear blocks. The method steps comprise converting a plurality of functional blocks into linear blocks such that the nonlinear blocks are divided into a plurality of states through switched linearization. The plurality of states generated by said switched linearization is then transitioned selectively based on a predetermined operational scenario. Each state is then tested separately to ensure that implementation of the states are safe. A first guard block is provided when a state is deemed unsafe such that the first guard block is enabled to cause a system shutdown so as to prevent further processing that can cause an unsafe result.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 9 is a tabular illustration showing state IDs in a system including multiple nonlinear blocks as per one embodiment of the present invention;

FIGS. 13 through 17 are different a flowchart illustration processing steps used to create guard conditions as per one embodiment of the present invention;

FIGS. 18 through 28 are a block diagram illustrating entries in a table processed to create the guard conditions as per alternate embodiments of the present invention.

DESCRIPTION OF THE INVENTION

Figure 6:
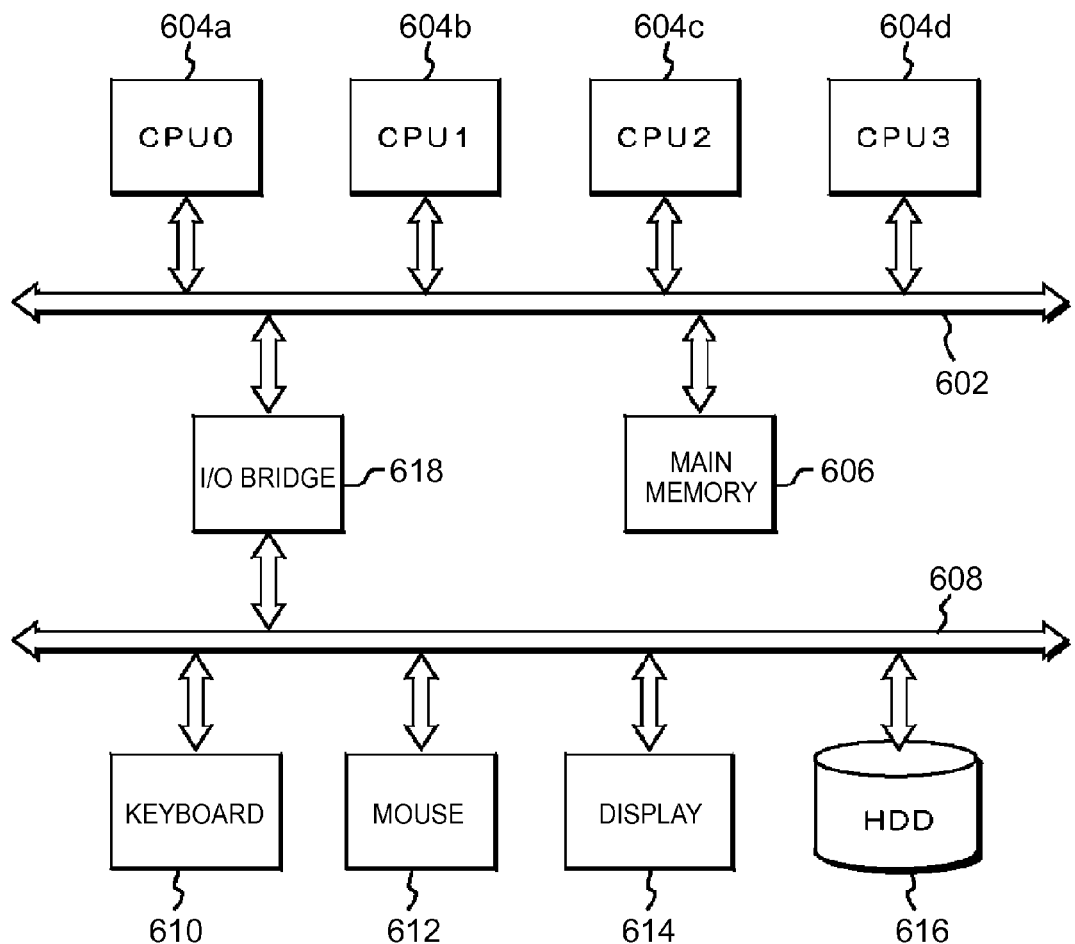
FIG. 6 is a block diagram illustrating exemplary hardware used in conjunction with one embodiment of the present invention.

FIG. 6 is a block diagram of one embodiment of the present invention as will be presently discussed. It should be noted that in the following figures and related discussion, the same components are denoted by the same reference numerals unless otherwise noted. In addition, while FIGS. 6 through 29 and related discussion is provided herein to ease understanding by providing specific examples relating to one or more embodiments of the present invention, it should be understood that the technical scope of this invention is not intended to be limited to the content of this embodiment and alternate embodiments may comprise other features and arrangements as can be appreciated by those skilled in the art.

Figure 1A:
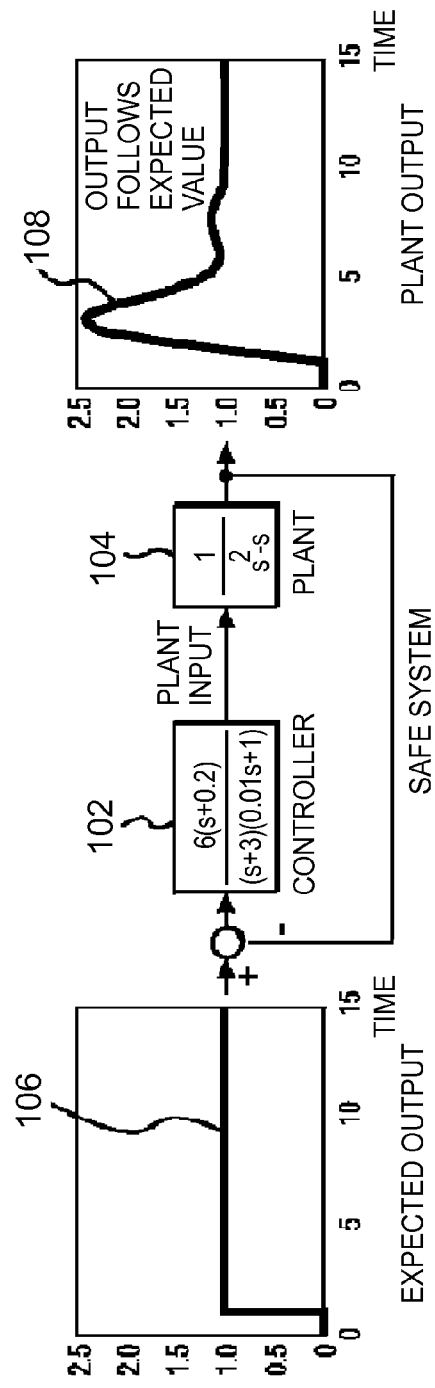
FIG. 1A is a block diagram showing a desired safe system.
Figure 1B:
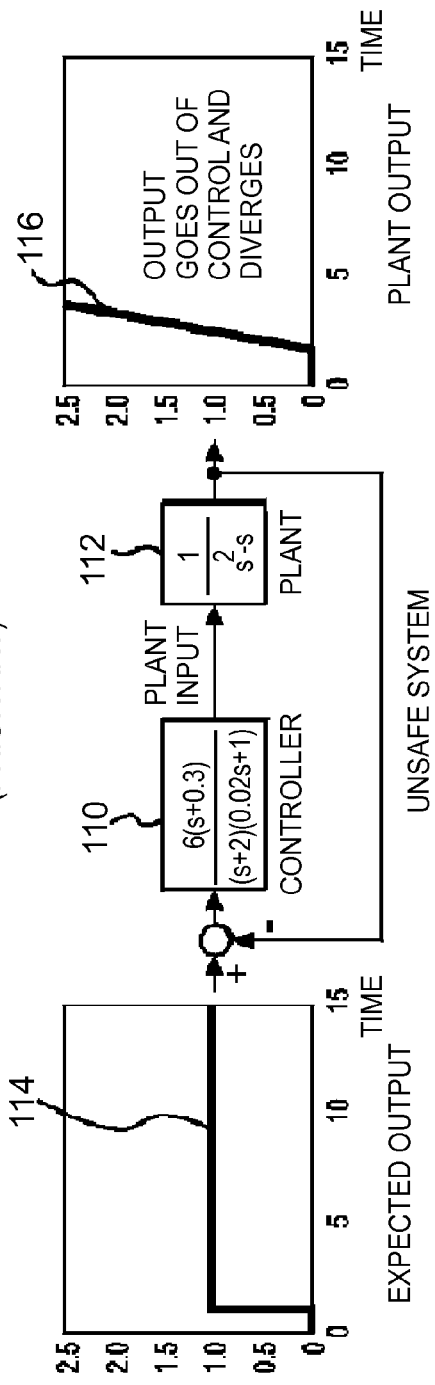
FIG. 1B is a block diagram of an unsafe prior art system as distinguishing from FIG. 1A.
Figure 2:
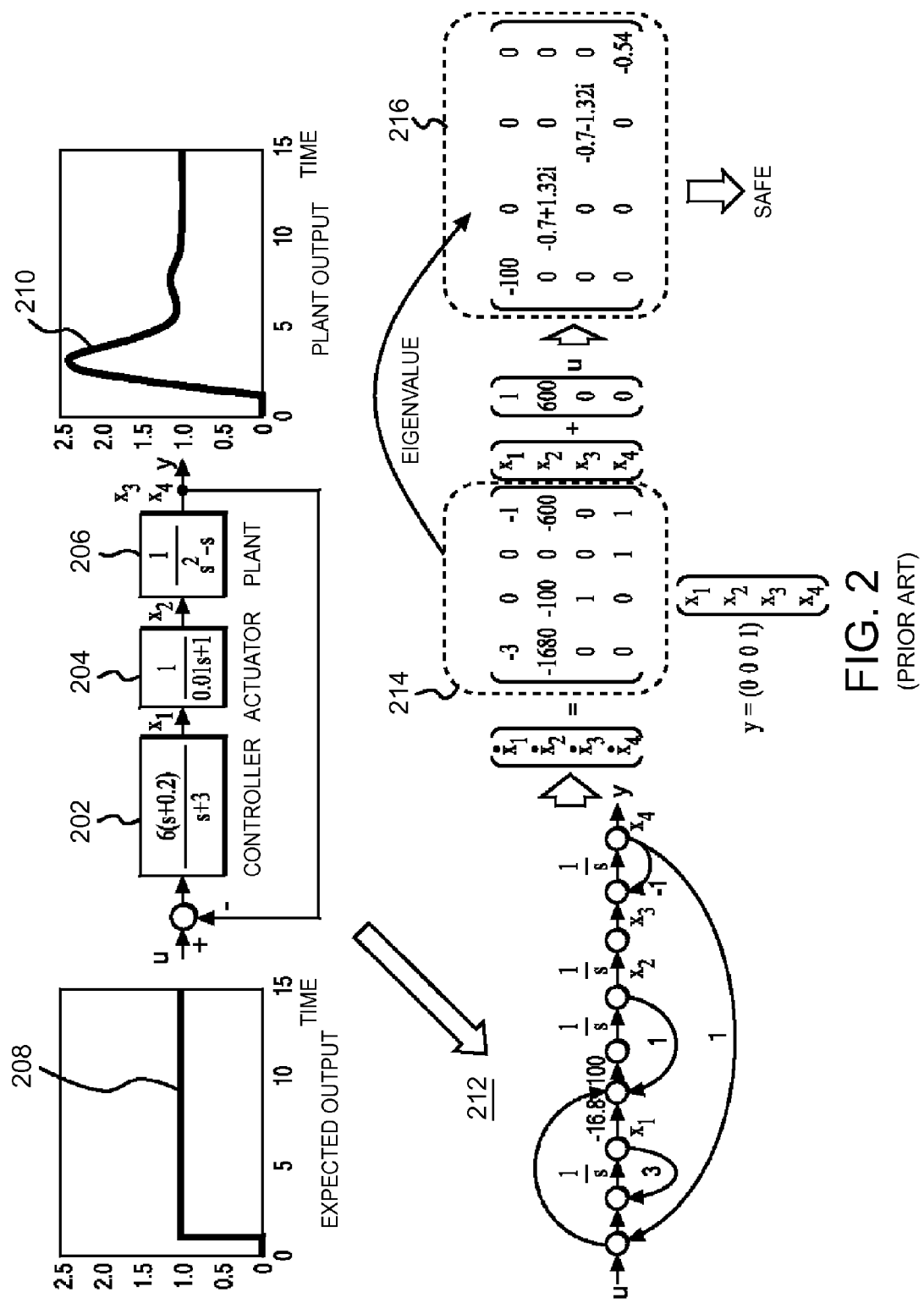
FIG. 2 is a block diagram illustrating a simulation system used for determining safety.
Figure 3:
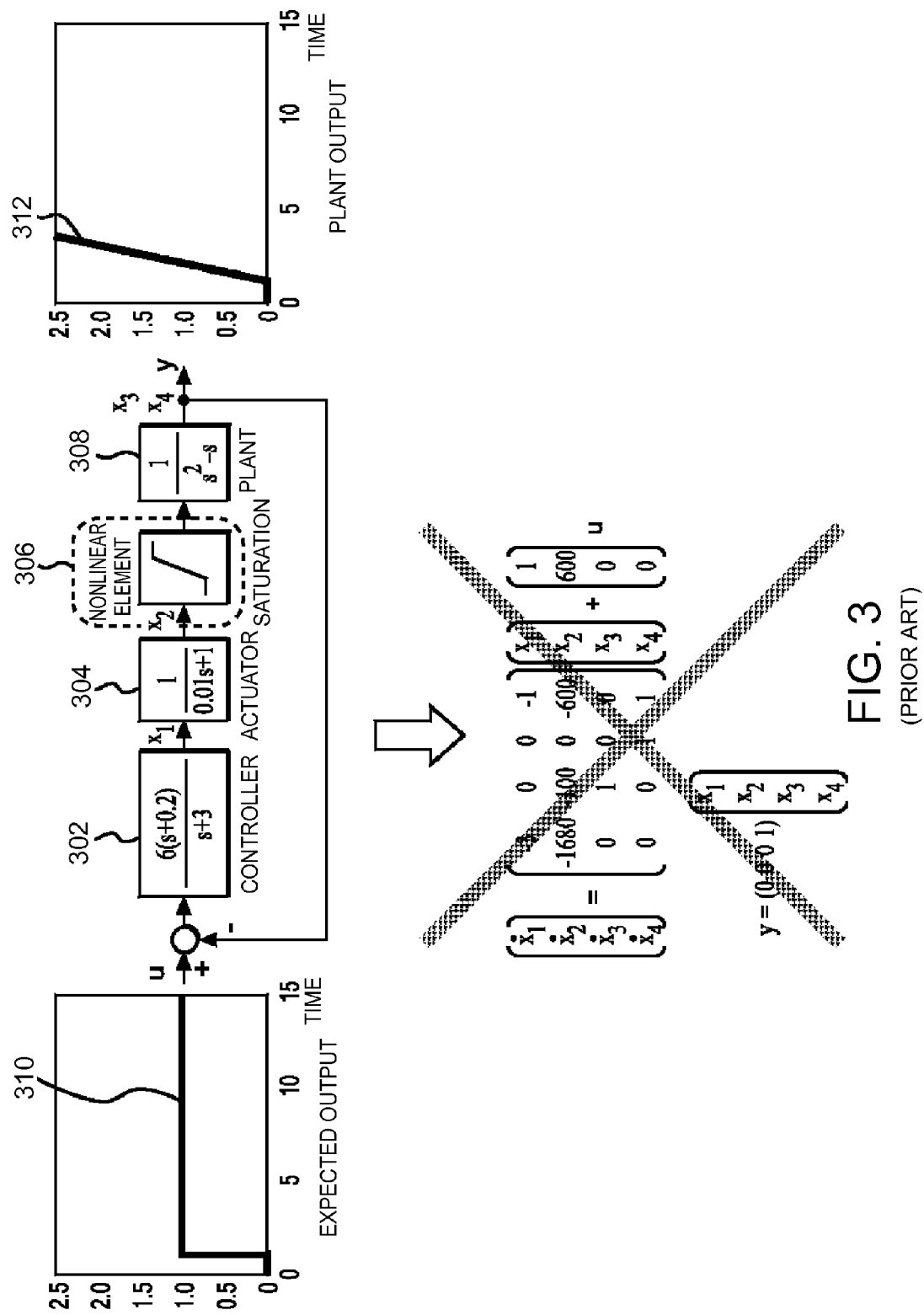
FIG. 3 is a block diagram illustrating application of a real system to prior art system of FIG. 2.

Referring back to FIG. 1, the components illustrated in the figure as will be discussed separately are representative of the hardware components such as those needed for a computer used to carry out one embodiment of the present invention. In FIG. 6, multiple CPUs, (i.e., CPU0 604*a*, CPU1 604*b*, CPU2 604*c* and CPU3 604*d*) are connected to a host bus 602. A main memory 606 is also provided that is in processing communication or alternatively connected to the host bus 602 to provide the CPU0 604*a*, CPU1 604*b*, CPU2 604*c* and CPU3 604*d* with needed memory (locations, spaces etc.) as needed for one or more applications including arithmetic processing.

In addition, display and communication means are provided as illustrated in form of a keyboard 610, a mouse 612, a display 614 as well as a hard disk drive 616 that are all connected to an I/O bus 608. The I/O bus 608 is connected to the host bus 602 through an I/O bridge 618. The keyboard 610 and the mouse 612 are used by an operator to perform selective operations, such as input entry and menu selections through clicking or other similar means. The display 614 is used for displaying screen images used to operate, through a GUI, a simulation system according to one embodiment of the present invention as will be discussed.

The present invention can be applicable and used in conjunction with a variety of computers and computing environments including but not limited to IBM® System X, which will now be used in way of example to aid understanding. The IBM® System X as discussed will have the required hardware components as needed to implement one embodiment of the present invention. In this example, Intel® Core 2 DUO may be used for CPU0 604*a*, CPU1 604*b*, CPU2 604*c* and CPU3 404*d*, and the operating system may be Windows® Server 2003. The operating system is stored in the hard disk drive 616, and read from the hard disk drive 616 into the main memory 606 upon startup of the computer system.

It should be noted that the hardware of the computer system usable for carrying out the embodiment of the present invention is not limited to IBM® System X, and the latter is only used as way of example. As appreciated by those skilled in the art, any other architecture CPU including but not limited to those with single-core, multi-core, multiprocessor or hybrid multi-core type, can be used. In other words, any other computer system can be used as long as it can run a simulation program of the present invention. The operating system used can also be varied and selected among many that exist commercially or otherwise. For example, the present embodiment can be sued used easily with any of the easily accessible Windows programs and system including but not limited to Windows® XP, Windows® 7 or Windows®, or any other operating system such as Linux®, Mac OS® or others as appreciated by those skilled in the art. Alternatively, a POWER™ 6-based computer system such as IBM® System P with operating system AIX™ may also be used.

Referring back to FIG. 6, stored in the hard disk drive 616 are also a plurality of computer programs or algorithms that may be required or optionally selected. Such programs may include one or more modeling tool such MATLAB®/Simulink® discussed earlier or any other system including one with a nonlinear block analysis module, a safety determination module, a compiler, a simulation execution module and a simulation scenario file among others. These will be loaded into to the main memory 606 (or other memory locations) arbitrarily and executed by any regular operation such as those conducted by the operating system.

Figure 7:
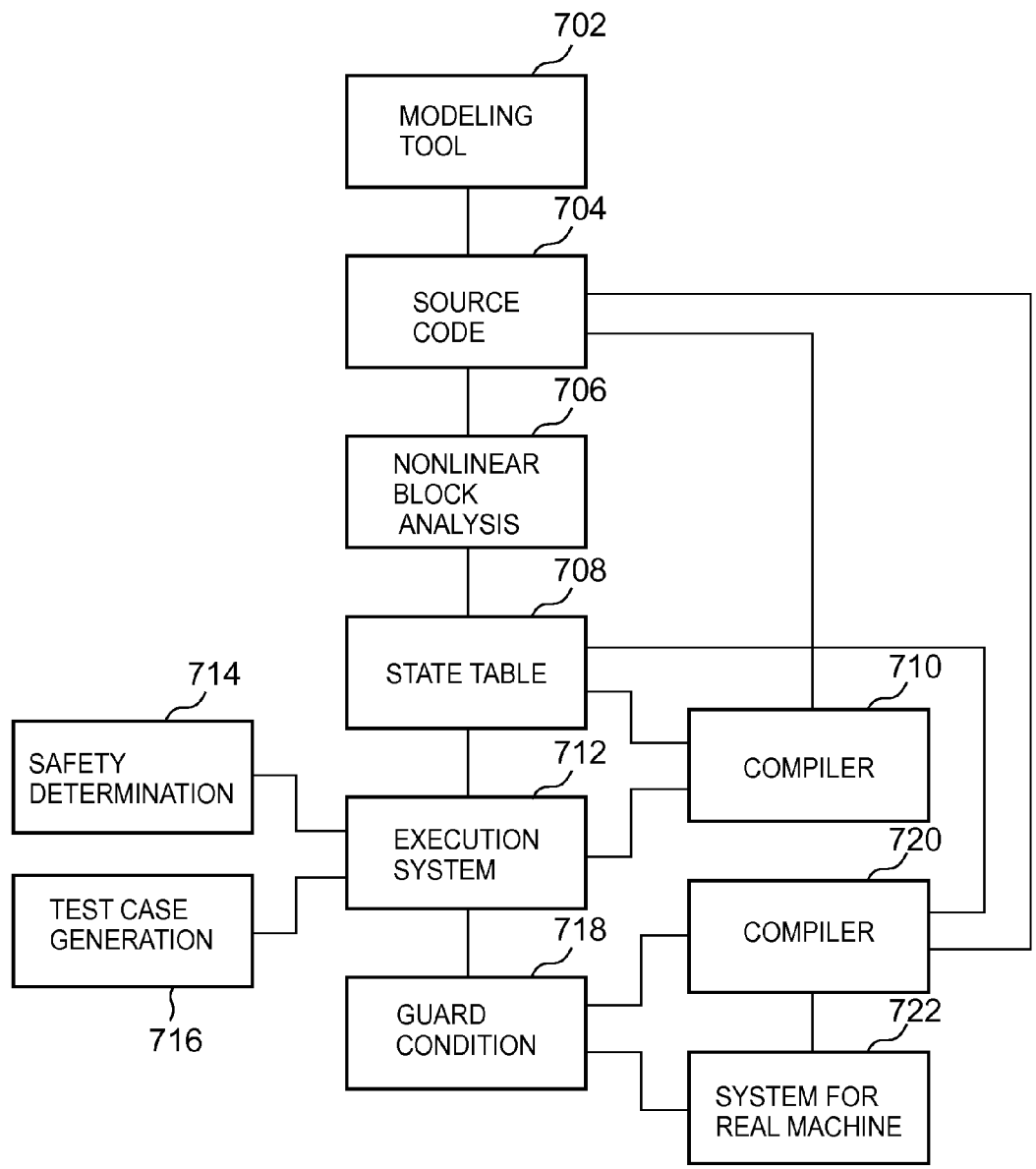
FIG. 7 is a functional block diagram relating to the embodiment shown in FIG. 6.

FIG. 7 is a functional logic block diagram according to one embodiment of the present invention. A simulation modeling tool 702 may be comprised of any existing tool such as MATLAB®/Simulink® or Scilab/Scicos as appreciated by those skilled in the art. The simulation modeling tool 702 has the function of allowing the operator to arrange the functional blocks on the display 614 in a GUI fashion, describe necessary attributes such as mathematical expressions, and associate the functional blocks with each other if necessary in order to draw a block diagram. The simulation modeling tool 702 also has the function of outputting C source code describing the functions equivalent to those of a block diagram described. Any programming language other than C can be used, such as C++ or FORTRAN. It is preferred that an MDL file be also output as the source code to describe the dependencies among the functional blocks. A source code 704 is created and thus output is stored in the hard disk drive 616.

Figure 5:
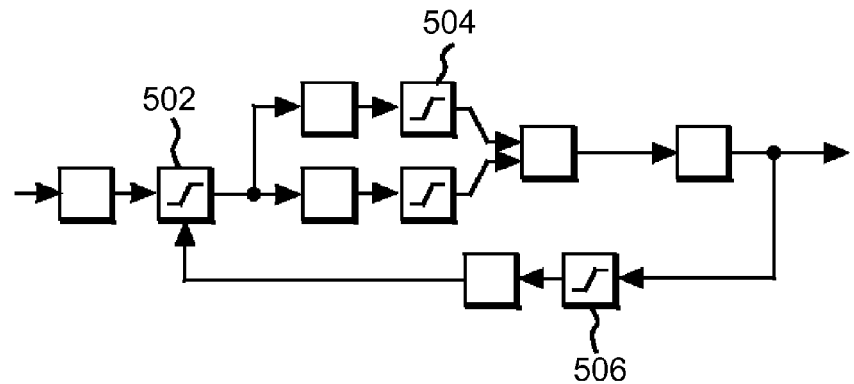
FIG. 5 is a block diagram illustrating a traditional simulation system having multiple nonlinear blocks.
Figure 8:
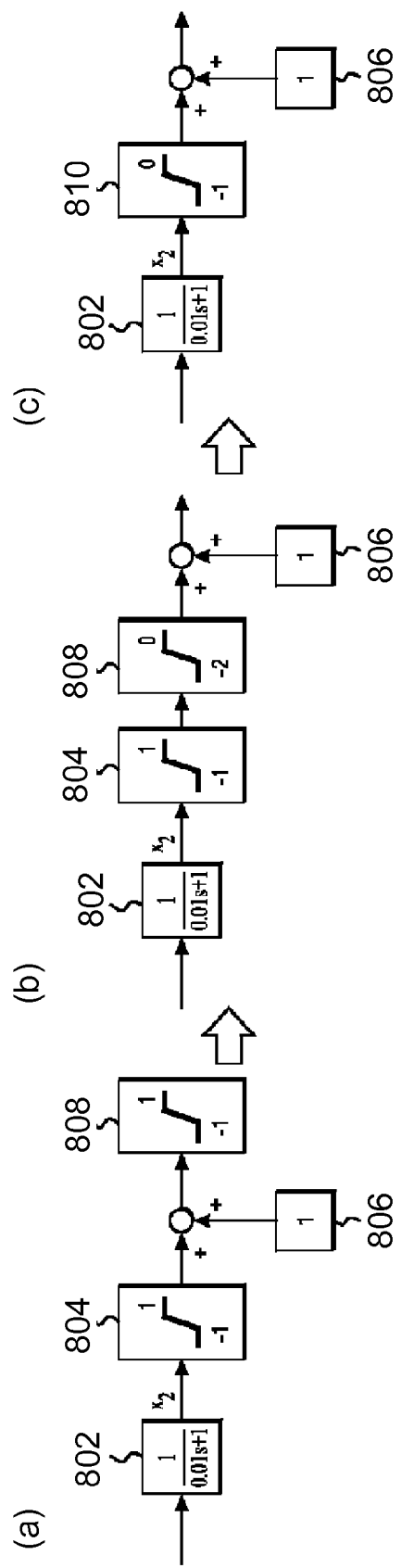
FIG. 8 is a diagram for describing processing for merging two or more nonlinear blocks as per one embodiment of the present invention.

The nonlinear block analysis module 706, as discussed, analyzes the source code 704, to determine/find the nonlinear blocks as nonlinear blocks such as those shown in FIG. 5 (502, 504 and 506). The blocks are then divided into linear regions of multiple states through a switched linear operation. In this regard, it is preferred that the nonlinear blocks be merged at a possible position (as shown in FIG. 8) before applying the switched linear operation.

This discussion can be better understood by reference to FIG. 8(a). As shown in FIG. 8(a), suppose that there are a block 802 without any internal state, a (nonlinear) block 804 having an internal state, a block 806 without any internal state and a (nonlinear) block 808 having an internal state. Suppose further that linearization is done through the switched linear operation. In this case, if each nonlinear block is linearized into three states, the number of states will be nine only in this section. Therefore, the relative position between the block 806 and the block 808 is changed as shown in FIG. 8(b), and the block 804 and the block 808 are merged to form a nonlinear block 810 as shown in FIG. 8(c), enabling state reduction from nine states to three states in this section. Examples of nonlinear blocks (i.e. such as used by Simulink®) are as follows (Backlash) block for modeling the behavior of a system with play Block for modeling that involves discontinuity at zero and linear gain elsewhere (Dead zone) block for generating a region of zero output Block for switching between two inputs Block for selecting a block input Block for discretizing inputs at specified intervals Block for limiting the rate of change of a signal Block for switching an output between two constants (Saturation) block for limiting the range of a signal After merging nonlinear blocks at possible positions to reduce the number of nonlinear blocks, the nonlinear block analysis module 706 generates a state table 708 for nonlinear blocks as schematically shown in FIG. 9. It is preferred that the generated state table 708 be stored in the hard disk drive 616. The nonlinear block will be described by taking, as an example, a code of Simulink®, especially for Saturation block. In general, the function of Saturation block is originally as follows:

```
Out=( ((In) >= (Saturation_LowerSat)) ? (Saturation_LowerSat) :
(((In) <= (Saturation_UpperSat)) ? (Saturation_UpperSat) : (In)) );
...Code 1.1
```

In this case, Saturation_LowerSat and Saturation_UpperSat represent the upper limit and lower limit of the Saturation block, respectively, and In and Out represent input and output. The output Out is determined by the value of input In. On the other hand, a block with a verification function added to the Saturation block is as follows:

```
Out=( ((In) >= (Saturation_LowerSat)) ? (Saturation_LowerSat) :
      (((In) <= (Saturation_UpperSat)) ? (Saturation_UpperSat) :
      (In)) );
Model_State=( ((In) >= (Saturation_LowerSat)) ?
Model_State+Saturation_LowerOffset
:
(((In) <= (Saturation_UpperSat)) ?
(Model_State+Saturation_UpperOffset) :
(Model_State+Saturation_MiddelOffset)) );
```

In this case, the code fragment following Model_State is an additional function for the verification block. Model_State, Saturation_LowerOffset, Saturation_UpperOffset and Saturation_MiddelOffset are variable names in the workspace of MATLAB, respectively representing system ID of the model, offset necessary to calculate the system ID when input of the Saturation block exceeds the upper limit of Saturation, offset of the system ID when the block input exceeds the lower limit of Saturation, and offset of the system ID when the block input exists between the upper limit and lower limit of Saturation. This additional function is to calculate the system ID from the input value of the Saturation block. The verification block is created by being compiled as S Function of Simulink® written in C language.

Referring back to FIG. 9, blocks B1, B2, B3, B4 and B5 represent respective nonlinear blocks, and their corresponding columns are operating regions of the nonlinear blocks, respectively. The operating region in this table is fitted to the maximum operating region (5 of B5 in FIG. 9) among the nonlinear blocks. Therefore, if a nonlinear block has only three operating regions like nonlinear block B1, since it cannot take the operating regions 3 and 4, the operating regions are shaded.

When such a table is given, if the number of operating regions is N and the number of nonlinear blocks is M in the table, state ID can be determined as an M-digit N-adic number. In other words, each digit of the state ID in N-adic notation represents the state of each nonlinear block, respectively. On the contrary, when the state ID is given, the state ID is converted into the N-adic notation to see the value of each digit so that the state (operating region) of each nonlinear block can be determined. For example, if (B1,B2,B3,B4, B5)=(0, 1, 2, 3, 2), the state ID=$0 \times 4^4 + 1 \times 4^3 + 2 \times 4^2 + 2 \times 4^2 + \times 4^1 + 2 \times 4^0 = 110$.

A compiler 710 refers to the source code 704 and the state table 708 to generate an executable code that runs on the computer system shown in FIG. 6 and to run the executable code on an execution system 712. A safety determination module 714 receives, from the execution system 712, a system state corresponding to the state ID, calculates a state matrix, determines safety by determining eigenvalues of the matrix based on the state matrix or the like, and returns the determination results to the execution system 712.

A test case generation block 716 may be used such that the output of each nonlinear block is used as an input to generate a test case for simulation under SIMO control and input to the execution system 712 as shown in FIG. 10, or such that a test case for simulation is generated directly based on information on unique internal logic and stored scenario and input to the execution system 712. The execution system 712 provides (writes) data on guard condition 718 to the hard disk drive 616 while operating according to a scenario 716 from a simulation scenario 716. Processing for generating the guard condition 718 will be described in detail later.

The compiler 720 refers to the source code 704, the state table 708 and the guard condition block 718 to generate a code that actually runs on a system 722 for real machine, i.e., a code for a so-called embedded system.

FIG. 10 is a schematic diagram illustrating an embodiment where the test case generation block 716 performs SIMO control on a verification target system (execution system) having blocks 1002, 1004, 1006 and 1008. Particularly here, the block 1004 and the block 1008 are nonlinear blocks. As mentioned above, this is one embodiment for generating a test case and the test case generation block 716 of the present invention is not limited to the use of SIMO control.

Figure 10A:
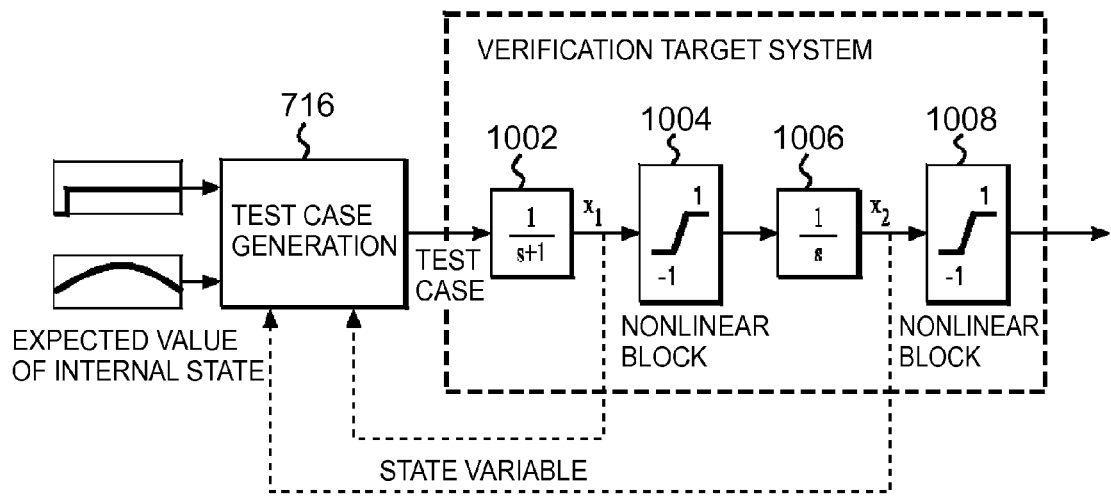
FIG. 10 is a block diagram illustrating the transition of states in a simulation system including nonlinear blocks as per one embodiment of the present invention.

As shown in FIG. 10A, a state variable as an input to the nonlinear blocks are input to the test case generation block 716, and this causes the test case generation block 716 to grasp the current state and give a test case output to the verification target system so that the system will transit to another state according to a predetermined scenario.

Figure 10B:
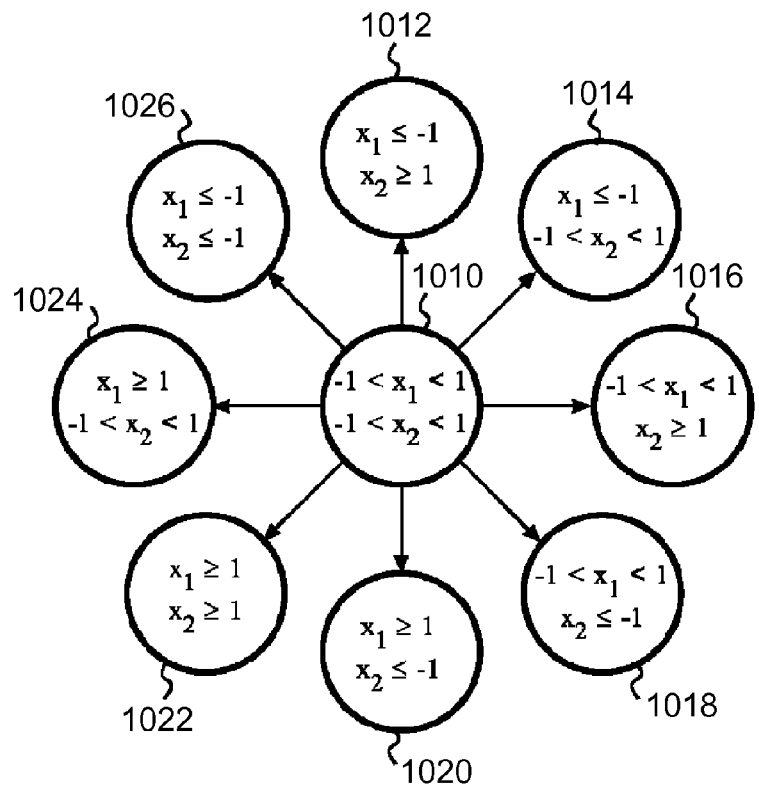

FIG. 10B is a diagram for describing the transition between states according to the test case. In FIG. 10B, the test case generation block 716 recognizes, based on an input state variable, that the current state is state 1010. The states to which the current state can transit next on the execution system are states 1012, 1014, 1016, 1018, 1020, 1022, 1024 and 1026. The test case generation block 716 selects one from the states 1012, 1014, 1016, 1018, 1020, 1022, 1024 and 1026 according to the embedded, predetermined scenario to control the test case output to transit the state.

Figure 4:
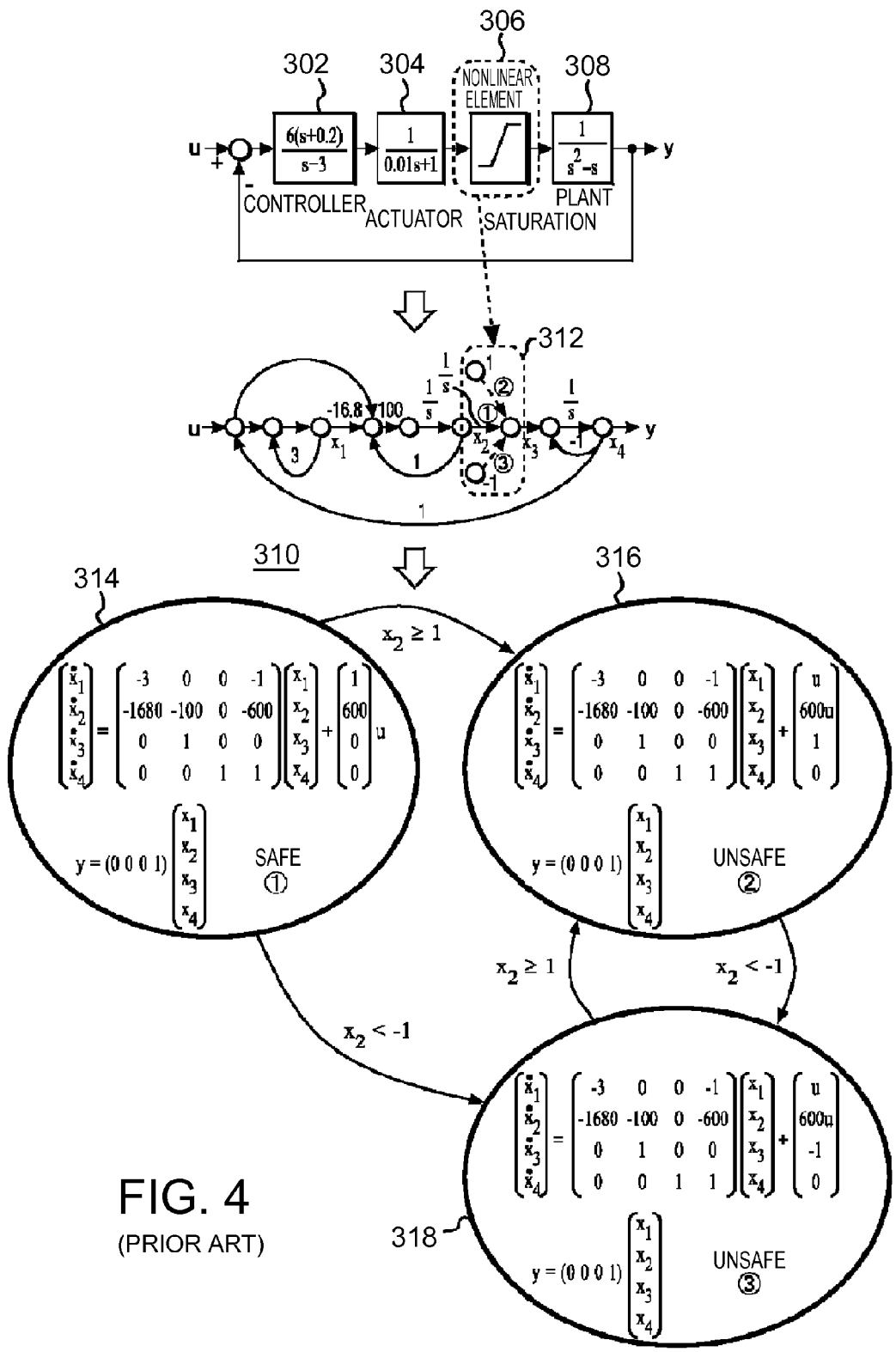
FIG. 4 is a block diagram illustrating a prior art approach for determining the safety of a simulation system using switched linearization techniques.
Figure 11:
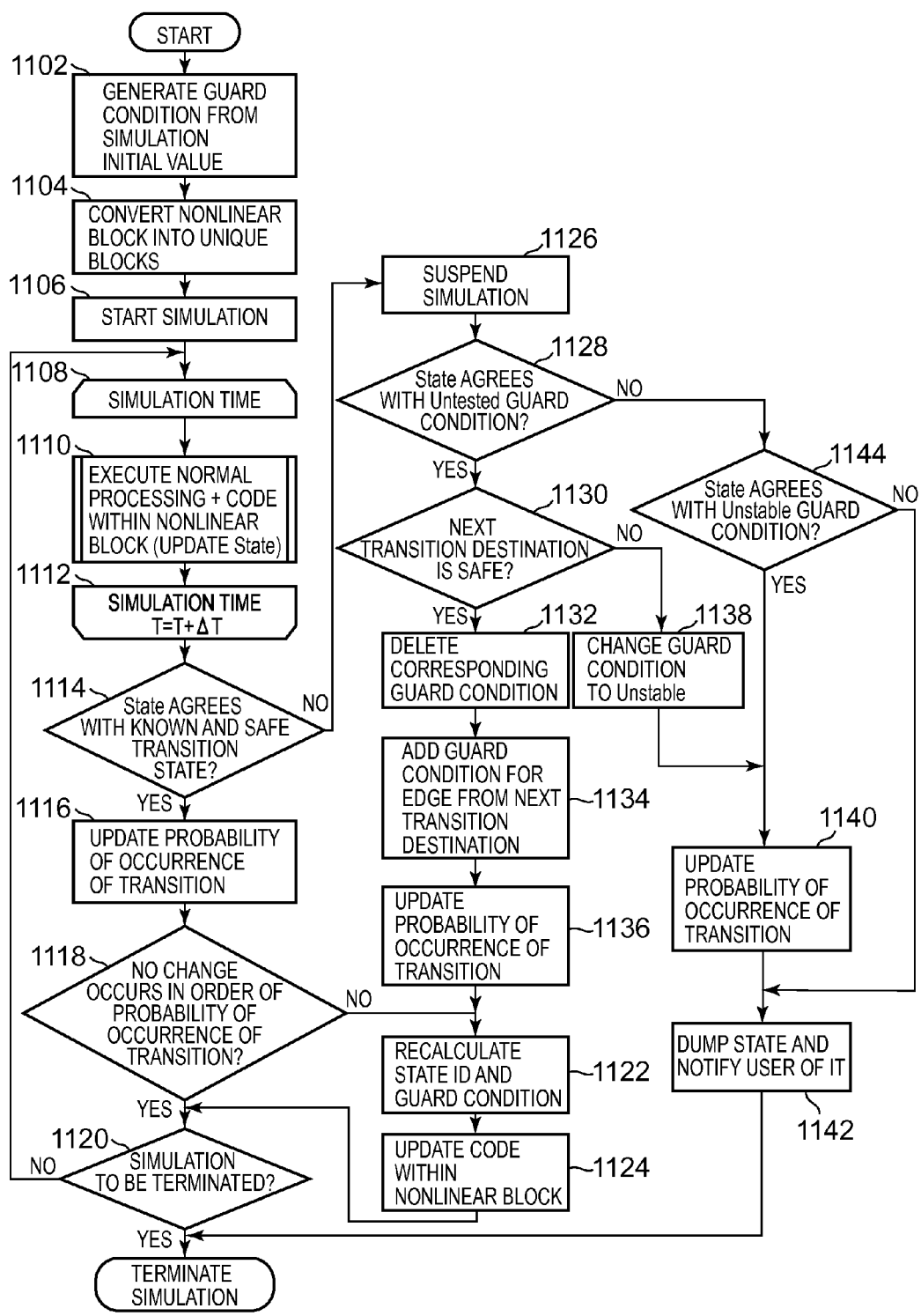
FIG. 11 is a flowchart diagram showing simulation processing according to one embodiment of the present invention.

Referring to the flowchart illustration of FIG. 11, the simulation operation can be understood as with respect to one embodiment of the present invention. The shown processing is performed by the execution system module 712 according to data from the test case generation block 716 shown in FIG. 7, but the safety determination module 714 is also called as necessary. First, in step 1102, a guard condition is created from a simulation initial value. This is to determine from which state the simulation is started. In step 1104, which may be executed in tandem with step 1102, the nonlinear block analysis module 706 converts a nonlinear block into plural unique linear blocks, for example, as shown in FIG. 4. Then, simulation is started at step 1106.

Through processing represented by steps 1108 through step 1112 (via step 1110), simulation time T is moved forward by ΔT. Particularly in step 1110, a code within the nonlinear block selected according to the test case is executed while performing normal processing. Then, State is updated. In other words, if the starting state is indicated by reference numeral 1206 in FIG. 12A, the starting state can transit to any one of state 1208, state 1210, state 1212, state 1214 and state 1216 as a matter of logic, and either one of them is selected as the next state according to the test case. Here, the term "the transition of states" is used in the same sense as in FIG. 10B, and is equivalent to the change in state ID as described with reference to FIG. 9.

FIG. 12B and FIG. 12C show an embodiment in which the simulation system is changing states with time as per embodiment discussed in conjunction with FIG. 12A.

Referring back to step 1114, it is determined whether State to transit to next agrees with a known and safe transition state. Here, "known and safe" means that the simulation system has visited the state at least once, and the safety determination module 714 has determined the state to be safe. Such a determination history is recorded in the hard disk drive 616, and this enables the determination in step 1114. If it is determined in step 1114 that State to transit to agrees with the known and safe transition state, the procedure proceeds to step 1116 in which the record of the probability of occurrence of state transition is updated.

In step 1118, it is determined whether no change occurs in the order of probability of occurrence of transition as a result of recording the probability of occurrence of the state transition, and if so, the procedure proceeds to step 1120 in which it is determined whether the simulation is to be terminated. If so, the simulation is terminated, while if not, the procedure returns to step 1108 to continue the simulation.

Returning to step 1118, if it is determined that an change occurs in the order of probability of occurrence of transition as a result of recording the probability of occurrence of the state transition, the procedure proceeds to step 1122 to recalculate the state ID and the guard condition. Here, the guard condition includes ones illustrated as guard condition 1202 and guard condition 1204 in FIG. 12, i.e., there are a guard condition indicating a transition to an unreached linear region (state) and a guard condition indicating a transition to an unsafe linear region (state).

After step 1122, the procedure proceeds to step 1124 in which the code within the nonlinear block is updated and the procedure returns to step 1120.

Figure 12:
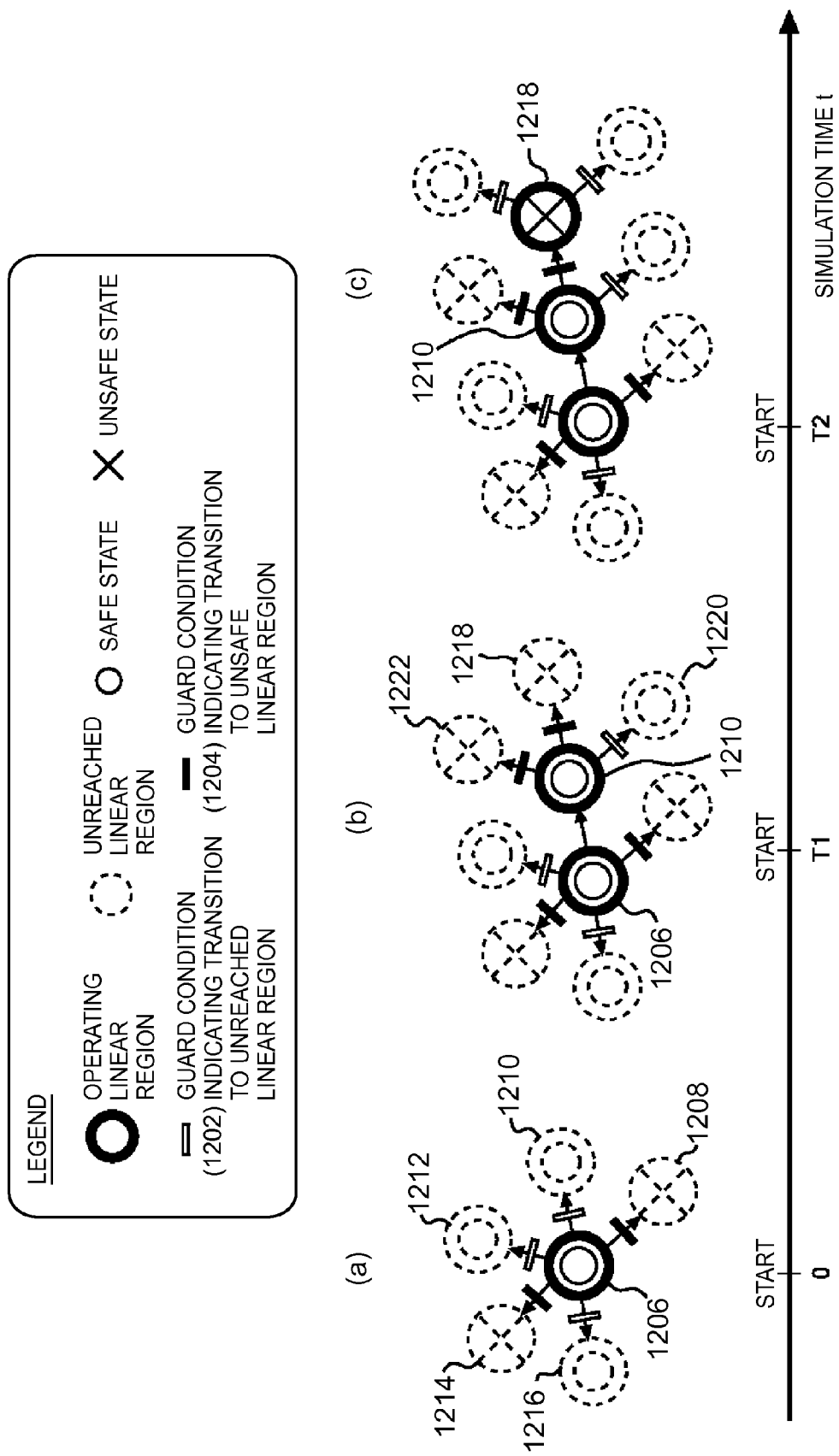
FIG. 12 is a block diagram illustrating the transition of states as a function of time in a simulation system including nonlinear blocks as per one embodiment of the present invention.

The guard condition indicating the transition to an unreached linear region (state) is the one illustrated as guard condition 1202 in FIG. 12, indicating that safety must be tested beforehand because the state ahead of the guard condition is unreached. The guard condition indicating the transition to an unsafe linear region (state) is the one illustrated as guard condition 1204 in FIG. 12, indicating that the state ahead of the guard condition has already been tested by the safety determination module 714 and determined to be unsafe. For example, the guard condition is implemented using the following code:

```
If (Model_State <= 4) {Stable( );}
else if (Model_State == 14) {Stable( );}
else {if (Model_State == 5) Unstable( );
     if (Model_State == 16) Untested( );
     if (Model_State == 24) Untested( );
     ... ...}
```

Thus, the guard condition block is functionally described to be the same block as the blocks 1002, 1004, 1006 and 1008 in FIG. 10. This guard condition block is described by M script of MATLAB® and implemented to be called by an embedded MATLAB Function block of Simulink®. Among guard condition blocks, Model_State is a variable name in the workspace of MATLAB, representing the state ID. Stable( ), Unstable( ) and Untested( ) functions are executed when the system state is safe, unsafe and unreached. These functions are described by M script of MATLAB or in C language. The details of Stable( ) Unstable( ) and Untested( ) will be described in connection with late steps in the flowchart of FIG. 11. It should be understood that the guard condition block can be dynamically rewritten by the simulation system during simulation because it is described by M script of MATLAB®.

Returning to step 1114, if it is determined that State to transit to is not known or does not agree with the safe transition state, the procedure proceeds to step 1126 in which the simulation is suspended. Next, in step 1128, it is determined whether the state agrees with any Untested guard condition, and if so, the procedure proceeds to step 1130 because it is a transition to an unreached state. Then, in step 1130, the safety determination module 714 is called to determine the safety of the state as the transition destination.

As a result of the determination in step 1130, if it is determined that the state as the transition destination is safe, the corresponding guard condition is deleted in step 1132. This corresponds to a case where state 1210 is determined to be safe upon transition from state 1206 to state 1210 in FIG. 12B, and therefore, the guard between state 1206 and state 1210 is removed.

In step 1134, a guard condition for an edge from the next transition destination is added. This corresponds to a case where new guards from state 1210 to state 1218, state 1220 and state 1222 are placed in FIG. 12B. In step 1136, the probability of occurrence of state transition is recorded, and the procedure returns to step 1122. Returning to step 1130, if it is determined that the sate as the transition destination is unsafe, the guard condition is changed to Unstable in step 1138. Next, in step 1140, the probability of occurrence of the transition is updated and recorded. Then, in step 1142, the state is dumped, notified to the user, and the simulation is terminated.

Returning to step 1128, if it is determined that the state does not agree with the Untested guard condition, the procedure proceeds to step 1144 in which it is determined whether the state agrees with an Unstable guard condition. If so, the procedure proceeds to step 1140 in which the probability of occurrence of the transition is updated and recorded. Then, in step 1142, the state is dumped, notified to the user, and the simulation is ended. This corresponds to a case where the determination in step 1144 is affirmative when the guard condition to the state 1218 is unstable after transition from state 1210 to state 1218 according to the test case in FIG. 12C. Therefore, the simulation is terminated via step 1140 and step 1142.

If it is determined in step 1144 that the state does not agree with the Unstable guard condition, the state is dumped in step 1142 because it is likely to be some error, notified to the user, and the simulation is terminated.

Referring next to flowcharts of FIG. 13 to FIG. 16, processing for listing and updating guard conditions updated and recorded in step 1136 or step 1140 will be described. The processing module for this processing may be included in the execution system 712, or in the hard disk drive 616 separately from the execution system 712. Before describing specific details, an outline of the processing is as follows in summary:

(1) Exchange values so that an entry rated as "Safe" and the incidence of which is highest will be set to zero
(2) Sort the matrix in ascending order based on Hamming distance and lattice distance
(3) Select an entry rated as "Safe" and the incidence of which is high
(4) Exchange values according to the Hamming distance so that the selected row will become the maximum or minimum without destroying the order relation to the other rows
(5) Exchange columns so that the selected row will become the maximum or minimum without destroying the order relation to the other rows
(6) Repeat (3) until no Safe entry remains in unoperated entries.

Figure 13:
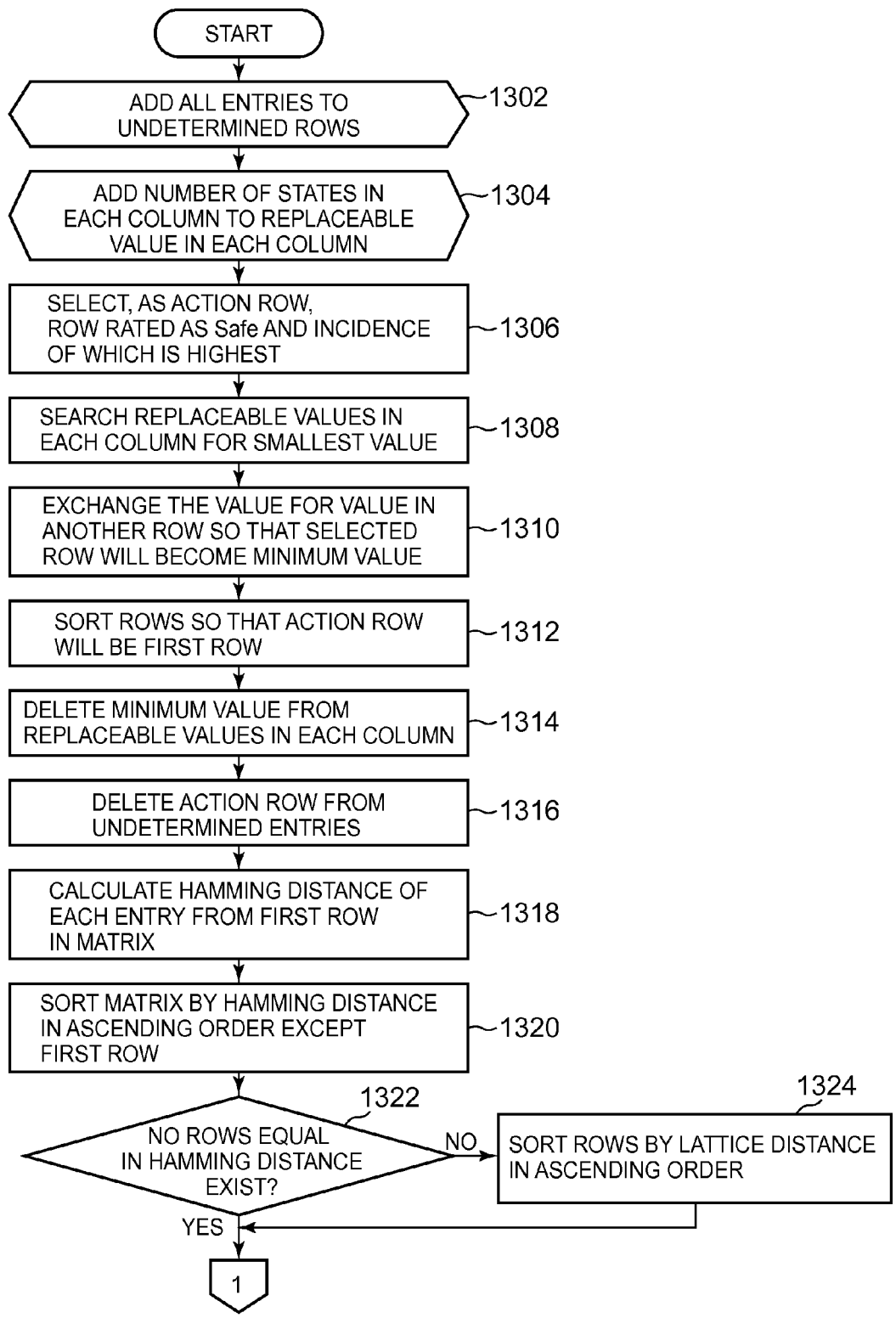
Figure 14:
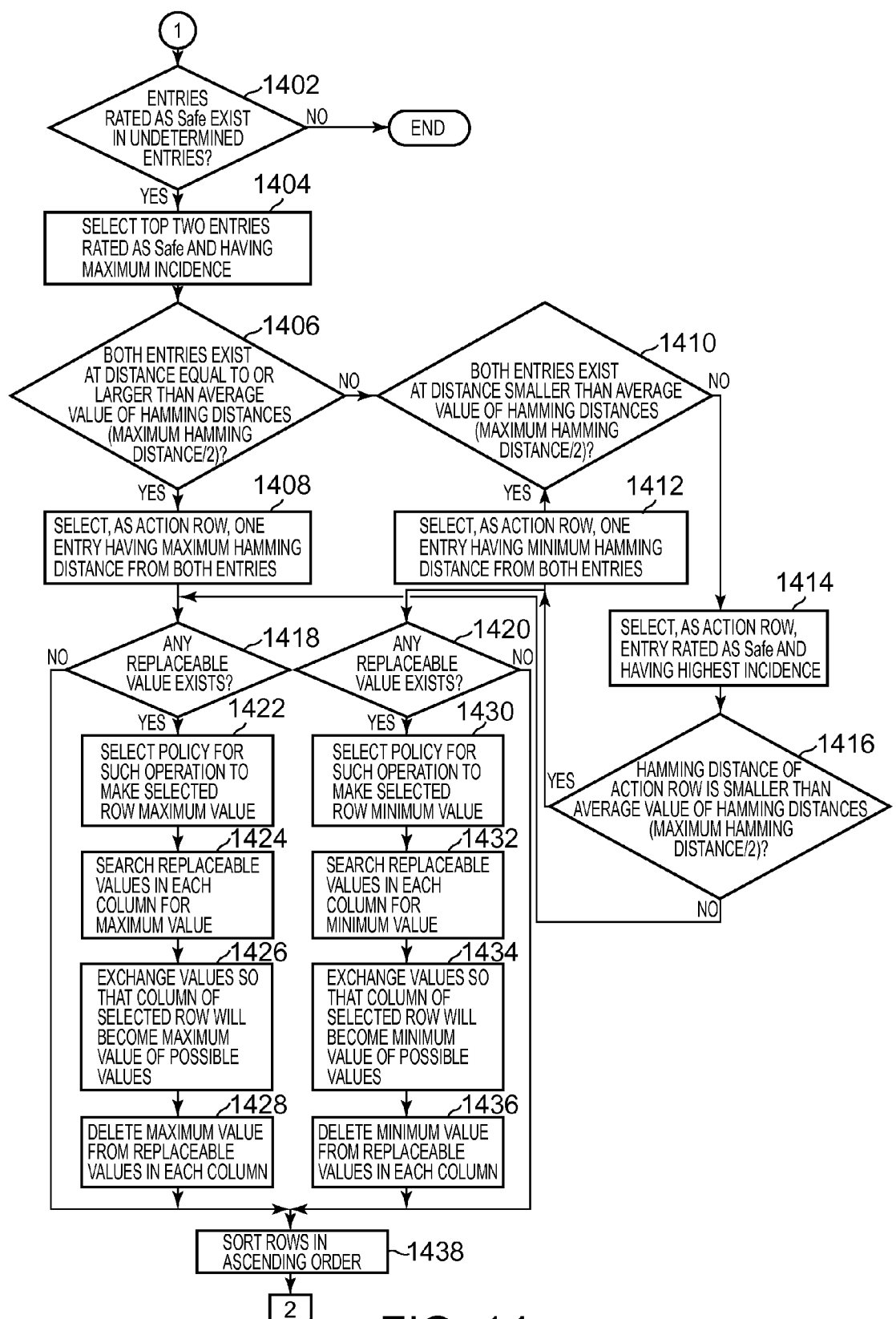

In FIG. 13, all entries are added to undetermined rows in step 1302. It is preferred that this processing be performed by reading, into the main memory 606, data accumulated as a result of recording of state IDs of the nonlinear blocks recorded in step 1116, step 1134 and step 1140 in the flowchart in FIG. 11.

In step 1304, the number of states in each column is added to a replaceable value in each column. As a result, data in a table as shown in FIG. 17 is obtained, for example. The nonlinear blocks in this table data correspond to the nonlinear blocks in the state table shown in FIG. 9.

In FIG. 17, columns from the first column to the fifth column correspond to state values taken by the block B1, B2, B3, B4 and B5 in FIG. 9, respectively. In other words, column 1 to column 3 take three states 0, 1 and 2, column 4 takes four states 0, 1, 2 and 3, column 5 takes five states 0, 1, 2, 3 and 4, a column on the right side of the column 5 expresses incidences as the frequencies of appearance in percent figures, and the rightmost column expresses the results of safety determination made by the safety determination block 714 as to whether they are Safe or Unsafe.

In step 1306, a row rated as Safe and the incidence of which is highest is selected. In FIG. 18, an action row is indicated by reference numeral 1802. In step 1308, the minimum value is searched from replaceable values in each column, and in step 1310, the value is exchanged for a value in another row so that the selected row will become the minimum value. This result is shown in FIG. 18. Further, replaceable values are shown in FIG. 19.

In step 1312, the rows are sorted so that the action row will be the first row. Next, in step 1314, the minimum value is deleted from replaceable values in each column as expressed by encircled numbers in FIG. 19. In step 1316, the action row is removed from the undetermined entries. In other words, row 2002 in FIG. 20 is not an action row. In step 1318, the Hamming distance of each entry is calculated from the first row in the matrix. Here, the Hamming distance means the number of different characters located at corresponding positions in two character strings equal in the number of characters. In step 1320, the matrix is sorted by Hamming distance in ascending order. In step 1322, it is determined whether rows equal in Hamming distance do not exist, and if exist, the rows are sorted by lattice distance in step 1324. Here, the lattice distance means the value of a difference between state IDs in decimal notation.

In FIG. 20, the Hamming distance of each entry is calculated from the entry 00000 as the minimum value and sorted, and further sorted by another value (lattice distance). In the above example, since there are four entries whose Hamming distance is 4, they are further sorted in ascending order. Next, the procedure goes to a flowchart of FIG. 14. In step 1402, it is determined whether entries rated as Safe exist in the undetermined entries. If not, the processing is ended.

If it is determined in step 1402 that entries rated as Safe exist in the undetermined entries, the top two entries rated as Safe and having the highest incidence are selected in step 1404. FIG. 21 shows undetermined entries 2102, 2104 and 2106 rated as Safe. In step 1406, it is determined whether both entries exist at a distance equal to or larger than the average value of Hamming distances (the maximum Hamming distance/2). If so, one entry having the maximum Hamming distance is selected from both entries as an action row in step 1408. Following step 1408, the procedure goes to a determination step in step 1418.

If it is determined in step 1406 that both entries do not exist at a distance equal to or larger than the average value of Hamming distances (the maximum Hamming distance/2), the procedure proceeds to step 1410 in which it is determined whether both entries exist at a distance smaller than the average value of Hamming distances (the maximum Hamming distance/2). If so, one entry having the minimum Hamming distance is selected from both entries as an action row in step 1412. Following step 1412, the procedure goes to a determination step in step 1420. Further, if it is determined in step 1410 that both entries do not exist at a distance smaller than the average value of Hamming distances (the maximum Hamming distance/2), the procedure proceeds to step 1414 in which an entry rated as Safe and having the highest incidence is selected as an action row.

Next, the procedure proceeds to step 1416 in which it is determined whether the Hamming distance of the action row is smaller than the average value of Hamming distances (the maximum Hamming distance/2), and if so, the procedure goes to the determination step in step 1418, while if not, the procedure goes to the determination step in step 1420. In step 1418, it is determined whether any replaceable value exists, and if so, a policy for such an operation to make the selected row the maximum value is selected in step 1422. Next, in step 1424, the maximum value is checked from replaceable values in each column. In step 1426, values are so exchanged that the column of the selected row will become the maximum value of the possible values. In step 1428, the maximum value is deleted from the replaceable values in each column, and the procedure proceeds to step 1438 to sort the rows in ascending order. If it is determined in step 1418 that there is no replaceable value, the procedure proceeds directly to step 1438.

In step 1420, it is determined as whether any replaceable value actually exists. If such value exists, a policy for such an operation to make the selected row the minimum value is selected in step 1430. Next, in step 1432, the minimum value is checked from replaceable and possible values in each column. In step 1434, values are so exchanged that the column of the selected row will become the minimum value of the possible values. In step 1436, the minimum value is deleted from the replaceable values in each column, and the procedure proceeds to step 1438 to sort the rows in ascending order. If it is determined in step 1420 that no replaceable value exists, the procedure proceeds directly to step 1438. FIG. 22 shows an example of the state up to this point. Here, a Safe entry having a large Hamming distance and the incidence of which is highest is selected, and the bit is exchanged for a bit the value of which is the second maximum value. In this example, the fifth row whose incidence is second highest and Hamming distance is large is selected. Since the bit as the maximum value in each column is fixed in the entries in the ninth row, bits are so exchanged using replaceable bits that the entries in the fifth row will be maximum. In this case, since 2 and 1 are replaceable in the fourth column, the bits are exchanged. The result of exchanging the bits is shown in FIG. 23. Here, since 1 and 2 are exchanged in the fourth column, 1 and 2 are deleted from the replaceable values in the fourth column.

Figure 15:
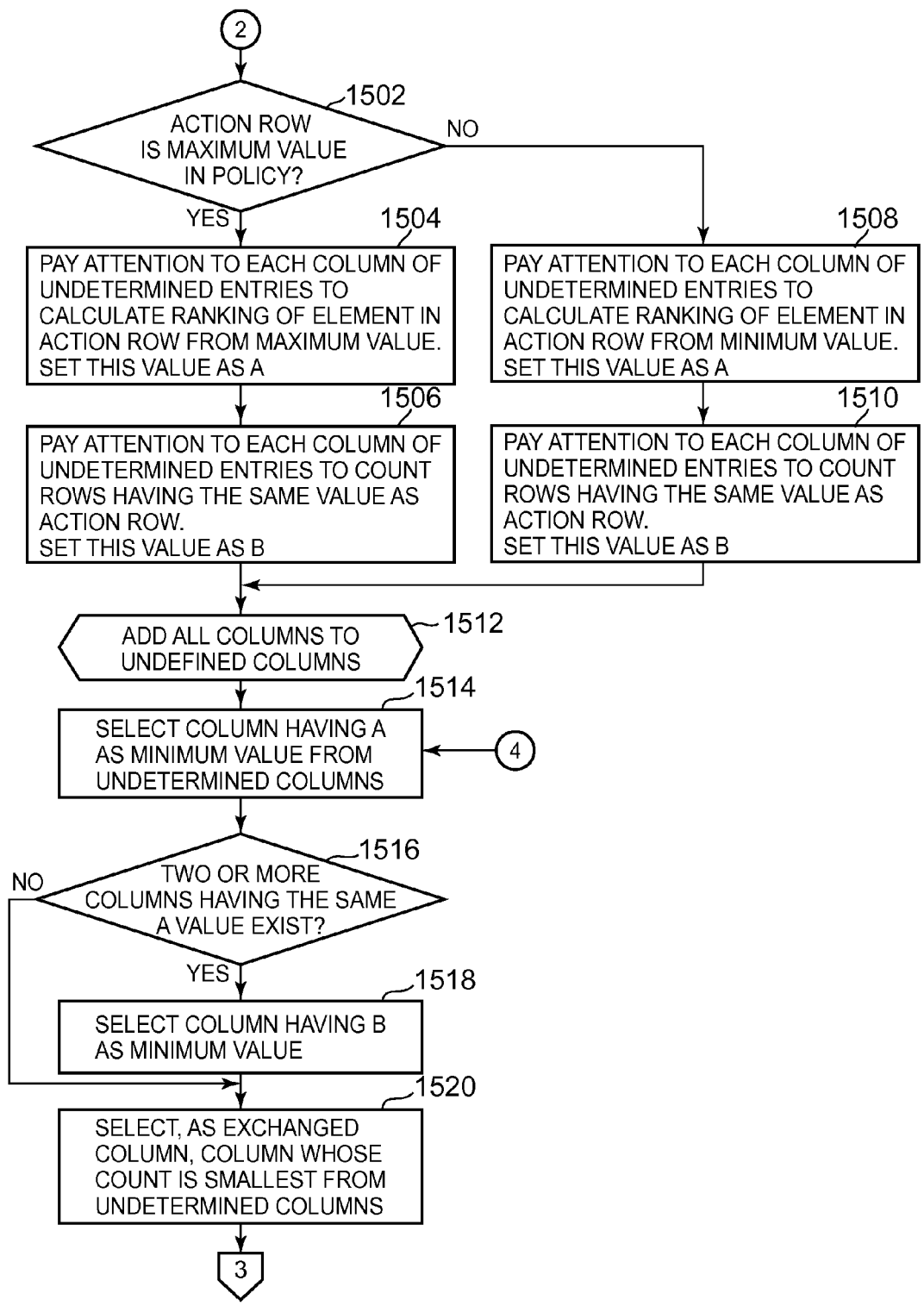

Next, the procedure moves to a flowchart of FIG. 15. In step 1502, it is determined whether the action row is the maximum value in the policy. This policy is already decided at step 1422 or step 1430 in FIG. 14. If it is determined in step 1502 that the action row is the maximum value in the policy, attention is paid to each column of undetermined entries in step 1504 to calculate the ranking of the element in the action row from the maximum value and set the value as A. Next, in step 1506, attention is paid to each column of undetermined entries to count the rows having the same value as the action row and set the value as B. In step 1502, it is determined whether the action row is or is not the maximum value in the policy. In this case, attention is paid to each column of undetermined entries in step 1508 to calculate what order the element in the action row take—from the minimum value and subsequently this value is set as the value A. Next, in step 1510, attention is paid to each column of undetermined entries to count the rows having the same value as the action row and set the value as B. In step 1512, all columns are added to undetermined columns. Next, in step 1514, a column having A as the minimum value is selected from the undetermined rows.

In step 1516, it is determined whether there are two or more columns having the same A value, and if so, a column having B as the minimum value is selected in step 1518. The column whose count is smallest is selected as an exchanged column from the undetermined columns in step 1520. The value thus obtained is expressed as A(B) in FIG. 24 and subsequent figures. According to this step, if columns are exchanged such that the selected entry will become the maximum value in the column of the entry, the result will be as shown in FIG. 24.

In the case illustrated in FIG. 24, since the first and ninth rows as the maximum value and the minimum value, respectively, these values remain and represent the maximum and minimum values even in the case where the columns are exchanged (attention will be paid to the other rows, i.e., the second to eighth rows). The columns can be replaced such that the entry in the fifth row will be the second maximum value. For example: first will be the bit of the selected entry in the first column of the second to eighth rows is 0. Since this is the third place after values 2 and 1 in descending order and there are five entries having 0 value in the other rows, this is expressed as 3(5). In the second column, the bit of the selected entry is 2, and 2 is the maximum value in the second to eighth rows to which attention is paid. Since no other row takes the value of 2, this is expressed as 1(1). Similarly, in the remaining columns, the ranking of the bit of the selected entry from the maximum value and the number of entries having the same value are counted. After that, columns are exchanged such that the selected column will be the maximum. To make the selected row a maximum value, each column must take a value larger than the values in the other rows.

Furthermore, since the determination on the value is started from the first column, the columns are so sorted that the ranking of respective columns from the first column will be ascending order. In this example, since the fifth row has the maximum value of 4 in the fifth column and does not have the value of 4 in the other entries, the fifth column is exchanged for the first column. The second column is also ranked first and does not have the value in the other entries. Although the second column also corresponds to the column to be exchanged for the first column, the fifth column becomes a target of being exchanged, rather than the second column, because 2<4. Thus, columns are sorted from the first row in ascending order, and this results in a table of FIG. 25.

Figure 16:
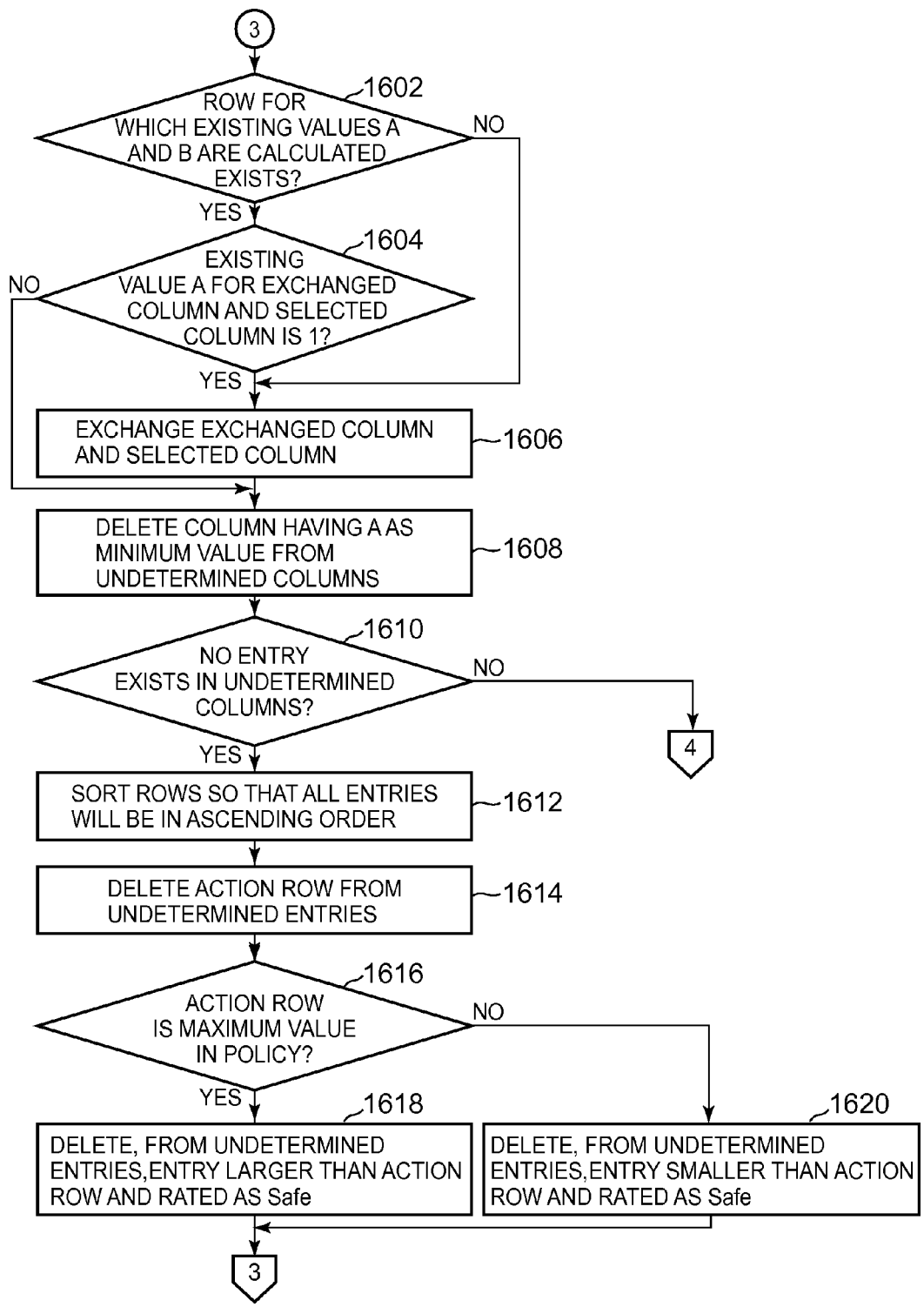

In the depicted flowchart, this indicates a shift in the procedure from step 1520 of FIG. 15 to step 1602 in the flowchart of FIG. 16. In step 1602, it is determined whether there is a row for which existing values A and B are calculated, and if so, the procedure proceeds to step 1604 in which it is determined whether the existing value A for the exchanged column and the selected column is 1, and if so, the procedure proceeds to step 1606. If it is determined in step 1602 that there is no row for which the existing values A and B are calculated, the process then moves on to step 1606.

In step 1606, the exchanged column and the selected column are exchanged. Then the procedure shifts from step 1606 to step 1608. Even if it is determined in step 1604 that the existing value A for the exchanged column and the selected column is not 1, the procedure proceeds to step 1608. In step 1608, a column having A as the minimum value is deleted from the undetermined columns.

In step 1610, it is determined whether there is an entry or if no entry exists in the undetermined columns. If there is an entry, the process then returns to step 1514 in the flowchart of FIG. 15. However, if no entry exists in the undetermined columns, the procedure proceeds to step 1612 in which all the entries are sorted by state ID value in ascending order. Next, in step 1614, the action row is deleted from the undetermined entries.

Similarly, in step 1616, it is determined whether the action row represents the maximum value as provided in the policy. (This policy is already determined/decided selectively at step 1422 or step 1430 as discussed.) If the action row has the maximum value as provided in the policy, an entry larger than the one in the action row, and rated as Safe, is then deleted from the undetermined entries in step 1618. On the other hand, however, if it is determined in step 1616 that the action row is not the maximum value in the policy, an entry smaller than the action row and rated as Safe is deleted from the undetermined entries in step 1620. The next processing step is provided by step 1402 of FIG. 14.

In the example of FIG. 25, if the entries in each row are sorted in ascending order after sorting the columns, the eighth and ninth rows can be packed as an entry. Therefore, an undetermined entry having a high incidence of Safe and a large Hamming distance is selected, and if any value can be increased by replacing the value with another, the value will be replaced. Thus, a table of FIG. 26 is obtained.

In FIG. 26, since the sixth row is only the undetermined Safe entry, this row is operated. Although values are exchanged to maximize this row, since replaceable values are only 1, 2 and 3 in the first column, 1 and 3 are exchanged. A table after exchanged is shown in FIG. 27. Therefore, in light of the dependency on the defined entry, columns are so replaced that the selected entry will become maximum. In this case, the processing in the flowchart shown in FIG. 16 is applied to FIG. 26. In other words, attention is paid to the second to seventh rows other than the defined entries (first, eighth and ninth rows. Similarly, it is counted where a selected entry in each column is ranked in descending order within the range of rows to which attention is paid (e.g.: 3 in the first column is the first place because it is the maximum value within the range of the second to seventh rows. Further there are two entries having 3 including the entry, and this is expressed as 1(2). Similarly, since 1 in the second column is the maximum value within the range of the second to seventh rows and there are three entries having 1 including the entry, this is expressed as 1(3)). Like in the above example, although columns are so exchanged from the first row that the value will become the maximum in comparison with the other rows, columns needs to be replaced in such a manner that the eighth row already defined will become the maximum in comparison with the other rows.

Figure 28:
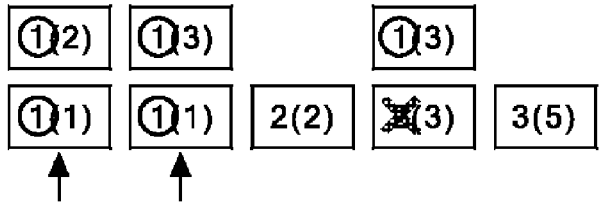

To this end, the first column is exchanged such that the values calculated from the ranking of the fifth row selected will be in ascending order. However, if the fourth column is set as the first column, the eighth row is then is already defined and will become/occupy the second place. Therefore the columns cannot be exchanged because this disturbs the dependency based on the ranking. Subsequently, the ranking of the first column and the second column is the first place, and the ranking of the eighth row is the first place. Since the ranking of the eighth row does not change even if the first and second columns are exchanged. Thus, the first and second columns are exchangeable. However, in this case, since the ranking does not change even if they are exchanged and there is no Safe entry unoperated in the other rows, coding is ended. This state is shown in FIG. 28.

Figure 29:
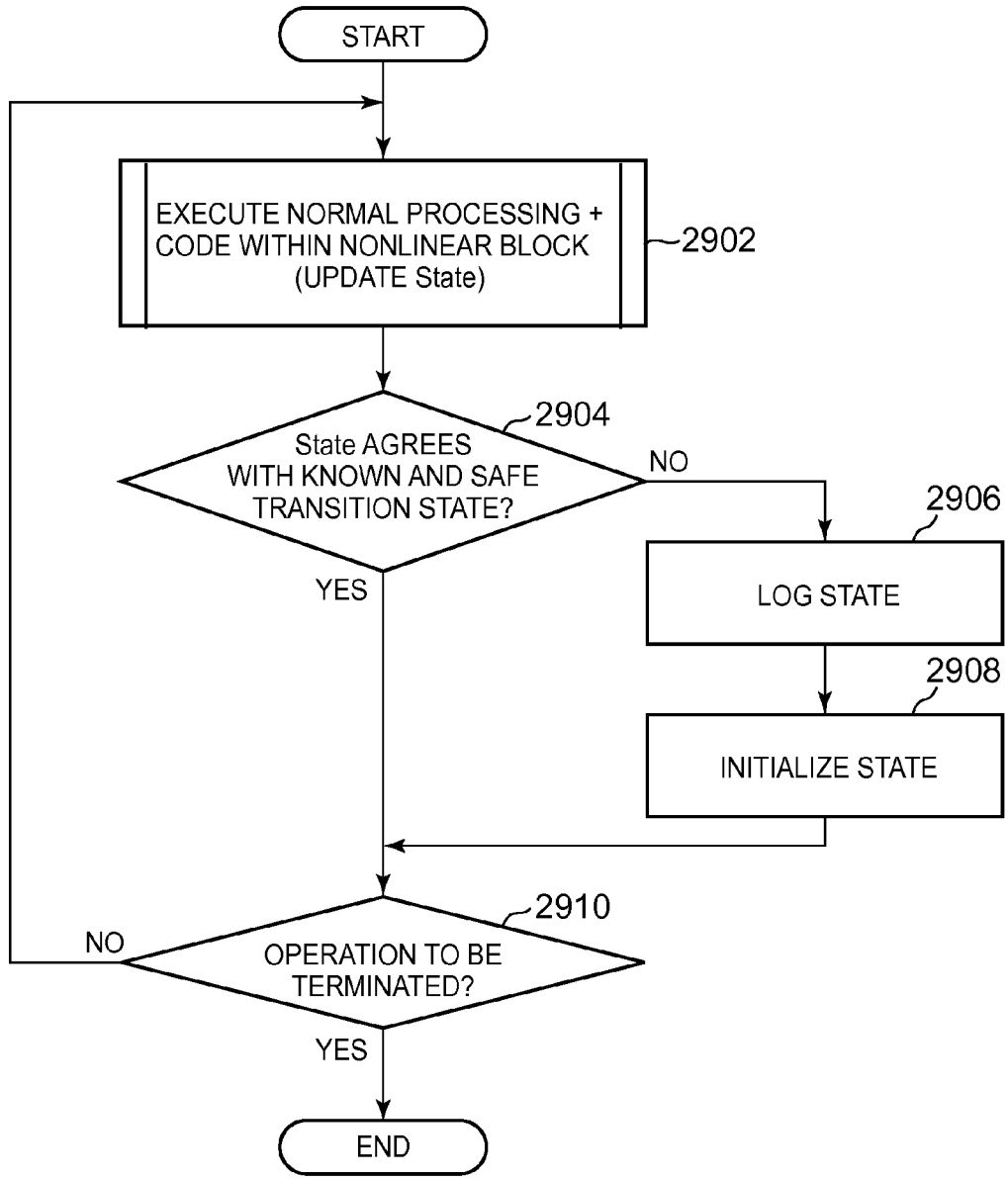
FIG. 29 is a flowchart diagram illustrating the operation of a system corresponding to a real machine using one embodiment of the present invention.

A table is then generated to list the state IDs of the nonlinear blocks and the safety is used to generate guard conditions. For example, the first row in the table of FIG. 28 generates the following code: if (Model_State=0) Stable( );

FIG. 29 is a flow diagram illustration of methodology as per one embodiment of the present invention showing a process for making the execution module work in the system 722 for a real machine. In this case, as will be described in more detail later, the execution module is generated by including the guard condition 718 (FIG. 7) thus generated and being compiled by the compiler 720. In step 2902 of FIG. 29, normal processing and code within a nonlinear block are executed based on the scenario presented in conjunction with the system 722 (i.e. for a real machine). This processing corresponds to a state transition as shown in FIG. 12.

In step 2904, an execution program created for the system uses the embedded guard condition in order to determine whether the state information agrees with a known and safe transition state. If it is determined in step 2904 that the state does not agree with any known and safe transition state, the execution program logs the state information as provided in step 2906 and initializes the state as shown in step 2908. The state here needs initializing to prevent runaway or malfunctioning parts as was provided in the example relating to an engine control system for automobiles.

The process then shifts from step 2908 to step 2910 to determine whether the operation is to be terminated. If so, the operation of the system for real machine is terminated, but if not, the process returns to step 2902 to continue the operation. If it is determined in step 2904 that State agrees with a known and safe transition state, the procedure proceeds directly to step 2910 to determine whether the operation is to be terminated.

While this invention has been described based on the specific embodiment, as discussed various configurations and techniques including modifications and replacements can be implemented as appreciated by those skilled in the art. For example, this invention is not limited to the architecture of a specific processor, the operating system and the like. It should also be understood that, although the aforementioned embodiment has been described by taking MATLAB®/Simulink® as an example, the invention is not limited thereto, and is applicable to any other modeling tool.

The following reference of numerals used in the drawings and related descriptions will now be provided for ease of reference.

DESCRIPTION OF REFERENCE NUMERALS

604a, 604b, 604c, 604d CPU
606 Main Memory
608 Bus
610 Keyboard
612 Mouse
614 Display
616 Hard Disk Drive
702 Modeling Tool
702 Simulation Modeling Tool
704 Source Code
706 Nonlinear Block Analysis Module
810 Nonlinear Block
708 State Table
710 Compiler
712 Execution System
714 Safety Determination Module
716 Test Case Generation Block
718 Guard Condition
720 Compiler
722 System for Real Machine
1202 Guard Condition
1204 Guard Condition While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for simulating operational processes of a machine, the method comprising the steps of:
   converting a plurality of functional blocks into one or more linear blocks and one or more nonlinear blocks;
   dividing said nonlinear blocks into linear regions having a plurality of states, through switched linearization, to produce a state table describing a plurality of transitions between the states;
   transiting among the plurality of states described by the state table selectively based on a predetermined operational scenario;
   during the transit, testing each of said states separately to determine a safety status of each of said states; and
   providing a first guard block upon determining that said safety status of said any one of said states is unsafe, said first guard block enabled to cause a system shutdown during an actual operation of said machine.

2. The method according to claim 1, further comprising the steps of:
   providing a second guard block when said safety status of one of said states is not yet determined;
   suspending operation of said system when reaching said second guard block in order to test said corresponding safety status of a subsequent state; and removing said second guard block or replacing it with said first guard block accordingly upon determining said safety status of said one of said states.

3. The method according to claim 2, further comprising a step of deleting said second guard block when said test result is deemed safe.

4. The method according to claim 1, further comprising the step of writing to a storage device of a computer, information about said state including state ID of a nonlinear block linearized by switched linearization process, and safety determination conclusions and results obtained after performing a safety test.

5. The method according to claim 4, further comprising the step of updating said first guard block based on written state ID and safety results.

6. The method according to claim 4, wherein a total number of nonlinear blocks in the system is M and a maximum number of states that a nonlinear block can process is N, said state ID being represented as an M-digit N-adic number.

7. The method according to claim 1, wherein the determining said safety status of each of said states uses an eigenvalue matrix.

8. A computer program product including a non-transitory computer readable medium having computer readable program code for causing a computer to effect the method steps of:
   simulating operational processes of a machine;
   examining one or more functional blocks and converting any nonlinear functional blocks into linear blocks using switched linearization such that said functional blocks are converted into one or more states, to produce a state table describing a plurality of transitions between the states;
   transiting among the plurality of states described by the state table selectively based on a predetermined operational scenario;
   during the transit, testing each of said states separately to determine a result of each of said states; and
   placing a first guard block before any one of said states in case said any one of said states has been determined to produce an unsafe result; and
   shutting down said machine system during actual operation of said machine upon encountering any of said guard blocks.

9. The program according to claim 8, further comprising the steps of:
   providing a second guard block when safety of one of said states is not yet determined;
   suspending operation of said machine when reaching said second guard block in order to test safety of a subsequent state; and
   removing said second guard block or replacing it with said first guard block accordingly upon safety determination of said one of said states.

10. The program according to claim 9, further comprising the step of deleting said second guard block when test result is deemed safe.

11. The program according to 8, further comprising a step of writing to a storage device of said computer, a state ID of any nonlinear block linearized by switched linearization and associated safety result obtained in response to said safety test step.

12. The program according to claim 11, further comprising the step of updating said first guard block based on said state ID and said safety result.

13. The program according to claim 11, wherein for a total number of nonlinear blocks M and a maximum number of states that can be processed by any nonlinear block N, said state ID being represented as an M-digit N-adic number.

14. A system for simulating operational steps of a machine, said operational steps having a plurality of operational functional blocks including nonlinear blocks, comprising:
   a storage device for storing data;
   means for converting a plurality of nonlinear functional blocks into linear blocks through switched linearization such that said functional blocks are converted into one or more states;
   a predetermined operational scenario for enabling said states to go from a first to a second transitional outcome;
   means for testing safety of said states;
   a first guard block created at a transition into any one of said states when the any one of said states is deemed unsafe by said testing means; and
   means for shutting down the machine in response to encountering said first guard block upon during actual operation of the machine.

15. The system according to claim 14, further comprising:
   a second guard block created when safety of any one of said states is not yet determined;
   providing a second guard block when said safety status of one of said states is not yet determined;
   means for suspending operation when encountering said second guard block to test safety of a subsequent state; and
   means for replacing said second guard block with said first guard block when upon safety test completion said state is deemed to be unsafe.

16. The system according to claim 15, further comprising means for deleting said second guard block when the test result is safe.

17. The system according to claim 16, wherein a state ID of a nonlinear block is created through switched linearization.

18. The system according to claim 17, wherein said state ID is stored in said storage device.

19. The system according to claim 18, wherein a said safety result relating to each said state are also stored in said storage device.

20. The system according to claim 19, further comprising means for updating said first guard block based on said stored state ID and safety result.

21. The system according to claim 17, wherein for a total number of nonlinear blocks M and a maximum number of states with a nonlinear block N, said state ID is defined as an M-digit N-adic number.

\* \* \* \* \*